(12) United States Patent
Do et al.

(10) Patent No.: US 9,640,444 B2
(45) Date of Patent: May 2, 2017

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jung-Ho Do, Yongin-si (KR);
Sanghoon Baek, Seoul (KR);
Sang-Kyu Oh, Gwacheon-si (KR);
Kwanyoung Chun, Suwon-si (KR);
Sunyoung Park, Seoul (KR); Taejoong Song, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/807,220

(22) Filed: Jul. 23, 2015

(65) Prior Publication Data

US 2016/0027703 A1    Jan. 28, 2016

Related U.S. Application Data

(60) Provisional application No. 62/028,132, filed on Jul. 23, 2014.

(30) Foreign Application Priority Data

Feb. 2, 2015    (KR) ........................ 10-2015-0016179

(51) Int. Cl.
*H01L 21/70*    (2006.01)
*H01L 21/8238*    (2006.01)
*H01L 27/092*    (2006.01)
*H01L 27/02*    (2006.01)

(52) U.S. Cl.
CPC .. *H01L 21/823871* (2013.01); *H01L 27/0207* (2013.01); *H01L 27/092* (2013.01)

(58) Field of Classification Search
CPC ...................... H01L 27/092; H01L 21/823871
See application file for complete search history.

(56) References Cited

U.S. PATENT DOCUMENTS 6,410,972 B1    6/2002  Sei et al.
6,732,344 B2    5/2004  Sakamoto et al.
6,762,479 B2    7/2004  Groves et al.
(Continued)

FOREIGN PATENT DOCUMENTS

JP    2010-147254 A    7/2010

*Primary Examiner* — Shaun Campbell
(74) *Attorney, Agent, or Firm* — Sughrue Mion, PLLC

(57) ABSTRACT

Provided is a method of fabricating a semiconductor device with a field effect transistor. The method may include forming a first gate electrode and a second gate electrode extending substantially parallel to each other and each crossing a PMOSFET region on a substrate and an NMOSFET region on the substrate; forming an interlayered insulating layer covering the first gate electrode and the second gate electrode; patterning the interlayered insulating layer to form a first sub contact hole on the first gate electrode, the first sub contact hole being positioned between the PMOSFET region and the NMOSFET region, when viewed in a plan view; and patterning the interlayered insulating layer to form a first gate contact hole and to expose a top surface of the second gate electrode, wherein the first sub contact hole and the first gate contact hole form a single communication hole.

18 Claims, 29 Drawing Sheets

(56) References Cited

U.S. PATENT DOCUMENTS

| | | |
|---|---|---|
| 7,698,675 B2 | 4/2010 | Kitano |
| 7,709,900 B2 | 5/2010 | Ikoma et al. |
| 7,759,185 B2 | 7/2010 | Nam et al. |
| 8,102,004 B2 | 1/2012 | Nagatomo |
| 8,198,733 B2 | 6/2012 | Tamaru |
| 8,581,348 B2 | 11/2013 | Rashed et al. |
| 8,741,718 B2 | 6/2014 | Sardesai |
| 8,951,907 B2 | 2/2015 | Richter et al. |
| 2002/0000567 A1 | 1/2002 | Groves et al. |
| 2003/0080365 A1 | 5/2003 | Sakamoto et al. |
| 2007/0089083 A1 | 4/2007 | Kitano |
| 2008/0042214 A1 | 2/2008 | Ikoma et al. |
| 2008/0272436 A1 | 11/2008 | Nam et al. |
| 2009/0079087 A1 | 3/2009 | Tamaru |
| 2009/0101982 A1 | 4/2009 | Nagatomo |
| 2012/0146106 A1* | 6/2012 | Richter ............. H01L 21/28512 257/288 |
| 2012/0313256 A1* | 12/2012 | Lu .................... H01L 21/31144 257/774 |
| 2013/0126978 A1* | 5/2013 | Becker ................. H01L 27/092 257/369 |
| 2013/0146982 A1 | 6/2013 | Rashed et al. |
| 2013/0181292 A1* | 7/2013 | Sardesai ......... H01L 21/823425 257/368 |
| 2014/0103402 A1* | 4/2014 | Hung ................... H01L 23/485 257/288 |
| 2014/0138750 A1 | 5/2014 | Wu et al. |

* cited by examiner

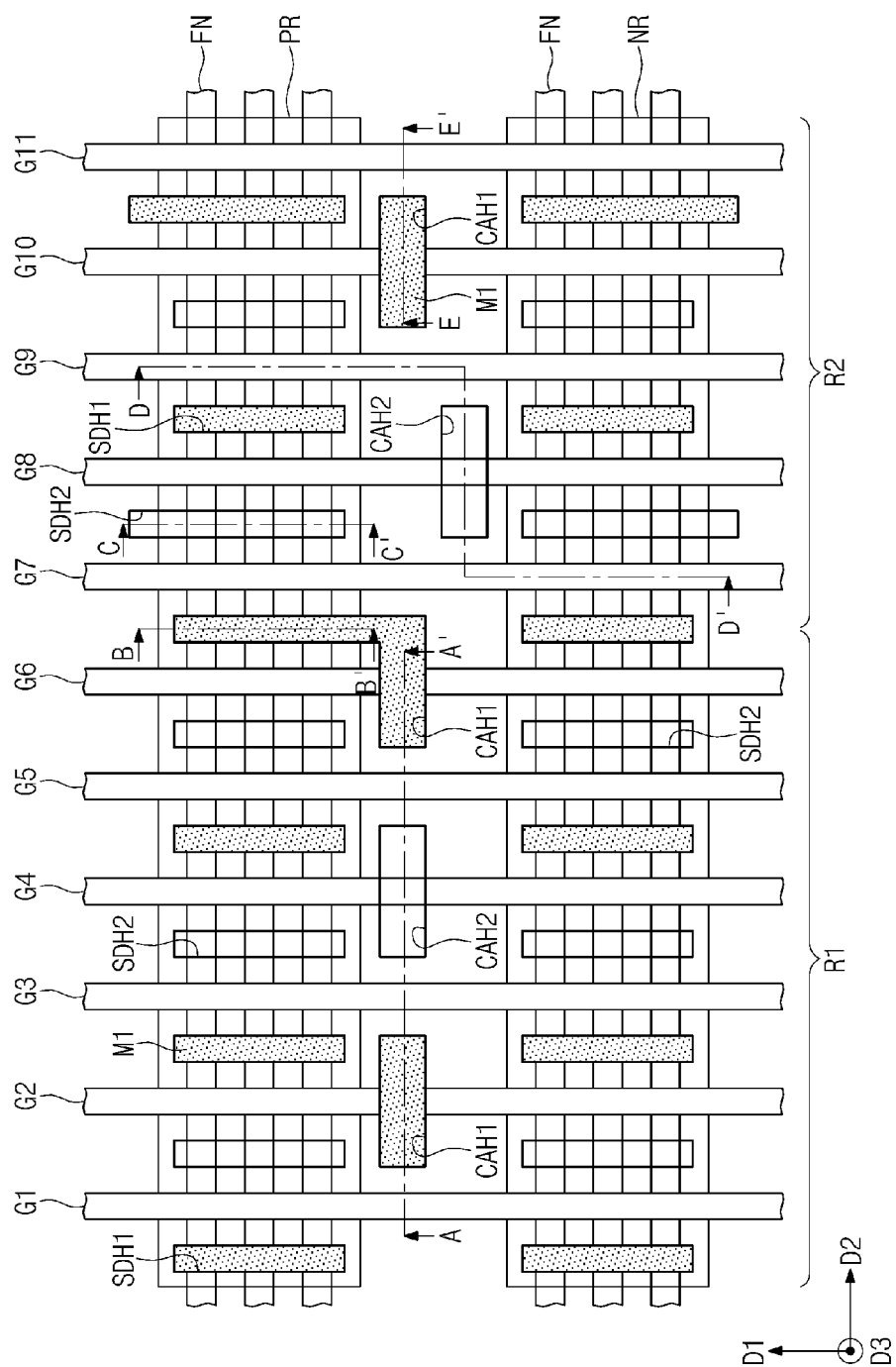

SEMICONDUCTOR DEVICE AND METHOD OF FABRICATING THE SAME

CROSS-REFERENCE TO RELATED APPLICATIONS

This application claims the benefit of from U.S. Provisional Patent Application No. 62/028,132, filed on Jul. 23, 2014, in the United States Patent and Trademark Office, and priority from Korean Patent Application No. 10-2015-0016179, filed on Feb. 2, 2015, in the Korean Intellectual Property Office, the disclosures of which are hereby incorporated by reference in their entireties.

BACKGROUND

Apparatuses and methods consistent with example embodiments relate to a semiconductor device and a method of fabricating the same, and in particular, to a semiconductor device including a field effect transistor and a method of fabricating the same.

Due to their small-sized, multifunctional, and/or low-cost characteristics, semiconductor devices are esteemed as important elements in the electronic industry. Semiconductor devices may include a memory device for storing data, a logic device for processing data, and a hybrid device including a memory and logic elements. To meet the increased demand for electronic devices with fast speed and/or low power consumption, it is needed to provide semiconductor devices with high reliability, high performance, and/or multiple functions. To satisfy these technical requirements, complexity and/or integration density of semiconductor devices are increased.

SUMMARY

One or more example embodiments provide a simplified method of fabricating a highly-integrated semiconductor device.

One or more example embodiments also provide a semiconductor device, in which field effect transistors with improved electric characteristics and increased integration density are provided.

According to example embodiments of the inventive concept, a method of fabricating a semiconductor device may include: forming a first gate electrode and a second gate electrode extending substantially parallel to each other and each crossing a PMOSFET region on a substrate and an NMOSFET region on the substrate; forming an interlayered insulating layer covering the first gate electrode and the second gate electrode; patterning the interlayered insulating layer to form a first sub contact hole on the first gate electrode, the first sub contact hole being positioned between the PMOSFET region and the NMOSFET region, when viewed in a plan view; and patterning the interlayered insulating layer to form a first gate contact hole and to expose a top surface of the second gate electrode, wherein the first sub contact hole and the first gate contact hole form a single communication hole.

In example embodiments, the method may further include forming a third gate electrode spaced apart from the first gate electrode, the second gate electrode being interposed between the first gate electrode and the third gate electrode; and patterning the interlayered insulating layer to form a second sub contact hole on the third gate electrode, wherein, when viewed in the plan view, the second sub contact hole is positioned between the PMOSFET region and the NMOS-FET region, the first and second sub contact holes are formed using different photomasks, and the first and second sub contact holes are connected to the first gate contact hole to form the single communication hole.

In example embodiments, the method may further include forming a fourth gate electrode spaced apart from the second gate electrode, the third gate electrode being interposed between the fourth gate electrode and the second gate electrode; and patterning the interlayered insulating layer to form a third sub contact hole on the fourth gate electrode, wherein the first and third sub contact holes are concurrently formed using a same photomask, and the forming the second sub contact hole includes: forming a first mask layer on the substrate to fill the first and third sub contact holes, after the forming the first and third sub contact holes; and patterning the first mask layer and the interlayered insulating layer to form the second sub contact hole between the first and third sub contact holes when viewed in the plan view.

In example embodiments, the forming the first gate contact hole may include: forming a second mask layer on the substrate to fill the second sub contact hole, after the forming the second sub contact holes; and patterning the second mask layer, the first mask layer, and the interlayered insulating layer to expose the top surface of the second gate electrode.

In example embodiments, the first and second sub contact holes may be formed to have bottom surfaces that are positioned at levels different from levels of top surfaces of the first gate electrode and the third gate electrode.

In example embodiments, when viewed in the plan view, the single communication hole may be formed to be across the first gate electrode to the third gate electrode.

In example embodiments, the method may further include forming source/drain regions in at least one the PMOSFET region and the NMOSFET region, the source/drain regions being positioned at a first side and a second side of the first gate electrode; and forming conductive connection patterns at the first side and the second side of the first gate electrode, the conductive connection patterns being connected to the source/drain regions, wherein, when viewed in the plan view, the first sub contact hole includes an extended portion, which is overlapped with the at least one of the PMOSFET region and the NMOSFET region, the extended portion exposing a top surface of at least one of the conductive connection patterns.

In example embodiments, the method may further include forming source/drain regions in at least one of the PMOSFET region and the NMOSFET region, the source/drain regions being positioned on at least one of a first side and a second side of the first gate electrode and a third side and a fourth side of the second gate electrode; forming conductive connection patterns on at least one of the first side and the second side of the first gate electrode and the third side and the fourth side of the second gate electrode, the conductive connection patterns being connected to the source/drain regions; and pattering the interlayered insulating layer to form a source/drain contact hole, which exposes a top surface of at least one of the conductive connection patterns, wherein the source/drain contact hole is concurrently formed with the first sub contact hole.

In example embodiments, the method may further include forming a fifth gate electrode spaced apart from the second gate electrode with the first gate electrode being interposed between the second gate electrode and the first gate electrode; patterning the interlayered insulating layer to form a second gate contact hole, which exposes a top surface of the fifth gate electrode; forming a conductive layer on the substrate to fill the first sub contact hole and the first and second gate contact holes; and planarizing the conductive layer to form a first sub contact and first and second gate contacts in the first sub contact hole and the first and second gate contact holes, respectively, wherein the first sub contact and the first and second gate contacts are connected to form a single connection contact, and the single connection contact electrically connects the second gate electrode to the fifth gate electrode.

In example embodiments, the method may further include forming device isolation layers to define active patterns in the PMOSFET region and the NMOSFET region, wherein the first gate electrode and the second gate electrode are formed to be across the active patterns.

According to example embodiments of the inventive concept, a method of fabricating a semiconductor device may include: forming a plurality of gate electrodes included in a gate electrode group, the plurality of gate electrodes each crossing a PMOSFET region on a substrate and an NMOSFET region on the substrate; forming an interlayered insulating layer to cover the gate electrode group; patterning the interlayered insulating layer to form a sub contact hole to be across the gate electrode group, the sub contact hole being positioned between the PMOSFET region and the NMOSFET region, when viewed in a plan view; and patterning the interlayered insulating layer to form first and second gate contact holes, which expose top surfaces of a first gate electrode and a second gate electrode of the gate electrode group, respectively, the first gate electrode and the second gate electrode being positioned at first and second side portions of the gate electrode group, wherein the sub contact hole is connected to the first and second gate contact holes to form a single communication hole.

In example embodiments, the sub contact hole may be formed to have a bottom surface positioned at a level different from levels of top surfaces of the plurality of gate electrodes included in the gate electrode group, and the first and second gate contact holes may have depths greater than a depth of the sub contact hole.

In example embodiments, the forming the first and second gate contact holes may include: patterning the interlayered insulating layer to form a third gate contact, which exposes a top surface of a third gate electrode, the third gate electrode being included in the gate electrode group and positioned between the first gate electrode and the second gate electrode, and the first to third gate contact holes are concurrently formed.

In example embodiments, the method may further include: forming source/drain regions in at least one of the PMOSFET region and the NMOSFET region, the source/drain regions being positioned at a first side and a second side of each of the plurality of gate electrodes; and forming conductive connection patterns at the first side and the second side of the each of the plurality of gate electrodes, the conductive connection patterns being connected to the source/drain regions, wherein, when viewed in the plan view, the sub contact hole includes a first portion crossing the gate electrode group in a first direction and a second portion extending from the first portion in a second direction, the second direction perpendicular to the first direction, to be overlapped with the at least one of the PMOSFET region and the NMOSFET region, and he second portion of the sub contact hole is formed to expose a top surface of at least one of the conductive connection patterns.

In example embodiments, when viewed in the plan view, the sub contact hole may extend from the first gate electrode to the second gate electrode and may be overlapped with the first and second gate contact holes.

According to example embodiments of the inventive concept, a semiconductor device may include: a substrate including a PMOSFET region and an NMOSFET region; a first gate electrode and a second gate electrode formed substantially parallel to the substrate, the first gate electrode and the second gate electrode extending substantially parallel to each other and each crossing the PMOSFET region and the NMOSFET region; a first sub contact spaced apart from the first gate electrode in a vertical direction, the sub contact crossing the first gate electrode, and a first gate contact in contact with a top surface of the second gate electrode, the first gate contact being electrically connected to the first sub contact, wherein the first sub contact and the first gate contact are positioned between the PMOSFET region and the NMOSFET region, and wherein a top surface of the first sub contact is substantially coplanar with a top surface of the first gate contact.

In example embodiments, the semiconductor device may further include: source/drain regions provided on at least one of at a first side and a second side of the first gate electrode and a third side and a fourth side of the second gate electrode; conductive connection patterns connected to the source/drain regions; and source/drain contacts provided on the conductive connection patterns and electrically connected to the source/drain regions.

In example embodiments, a bottom surface and a top surface of the source/drain contacts may be positioned at substantially the same levels as a depth of the sub contact.

In example embodiments, the sub contact may include a first portion, which extends across the first gate electrode in a first direction, and a second portion, which extends in a second direction, the second direction perpendicular the first direction, to be overlapped with at least one of the PMOSFET region and the NMOSFET region.

In example embodiments, the sub contact may be electrically connected to one of source/drain regions provided on both sides of the gate electrodes through the second portion.

According to example embodiments of the inventive concept, a semiconductor device may include a substrate with a PMOSFET region and an NMOSFET region, first and second gate electrodes extending in a first direction parallel to a top surface of the substrate and crossing the PMOSFET and NMOSFET regions, source/drain regions provided at both sides of the first gate electrode and/or the second gate electrode, conductive connection patterns connected to the source/drain regions, source/drain contacts provided on the conductive connection patterns and electrically connected to the source/drain regions, and a connection contact crossing the first and second gate electrodes between the PMOSFET and NMOSFET regions, when viewed in a plan view. The connection contact may include a sub contact, which is spaced apart from the first gate electrode in a vertical direction to cross the first gate electrode, and a first gate contact, which is in contact with a top surface of the second gate electrode and is connected to the sub contact. Bottom and top surfaces of the source/drain contacts may be positioned at substantially the same levels as those of the sub contact.

In example embodiments, the semiconductor device may further include a third gate electrode spaced apart from the second gate electrode with the first gate electrode interposed therebetween. The connection contact may further include a second gate contact, which is in contact with a top surface of the third gate electrode and is connected to the sub contact. The sub contact and the first and second gate contacts may include the same material and may be connected to each other to form a single body of the connection contact. The connection contact may be formed to electrically connect the second gate electrode to the third gate electrode.

In example embodiments, the semiconductor device may further include source/drain regions provided at both sides of the first gate electrode and conductive connection patterns connected to the source/drain regions at both sides of the first gate electrode. When viewed in a plan view, the sub contact may include a first portion, which is extended to cross the first gate electrode, and a second portion, which is extended in the first direction to be overlapped with the PMOSFET region or the NMOSFET region. The sub contact may be connected to the conductive connection pattern through the second portion.

In example embodiments, the semiconductor device may further include source/drain regions provided in the PMOSFET and NMOSFET regions at a side of the first gate electrode, source/drain contacts provided at the side of the first gate electrode electrically connected to the source/drain regions, and a bar-shaped conductive line provided on the sub contact to extend in the first direction. When viewed in a plan view, the conductive line may be electrically connected to the first sub contact, the source/drain contact on the PMOSFET region, and the source/drain contact on the NMOSFET region through first to third vias. The second gate electrode may be electrically connected to the source/drain regions via the connection contact and the conductive line.

In example embodiments, one or more gate electrodes may be provided between the first and second gate electrodes. When viewed in a plan view, the sub contact may be extended in a second direction crossing the first direction to cross the one or more gate electrodes.

BRIEF DESCRIPTION OF THE DRAWINGS

The above and/or other aspects will be more apparent by describing certain example embodiments with reference to the accompanying drawings.

FIGS. 4, 6, 8, and 10 are plan views of the first logic cell of FIG. 1, which are illustrated to provide a description of a method of fabricating a semiconductor device according to an example embodiment.

DETAILED DESCRIPTION

Figure 1:
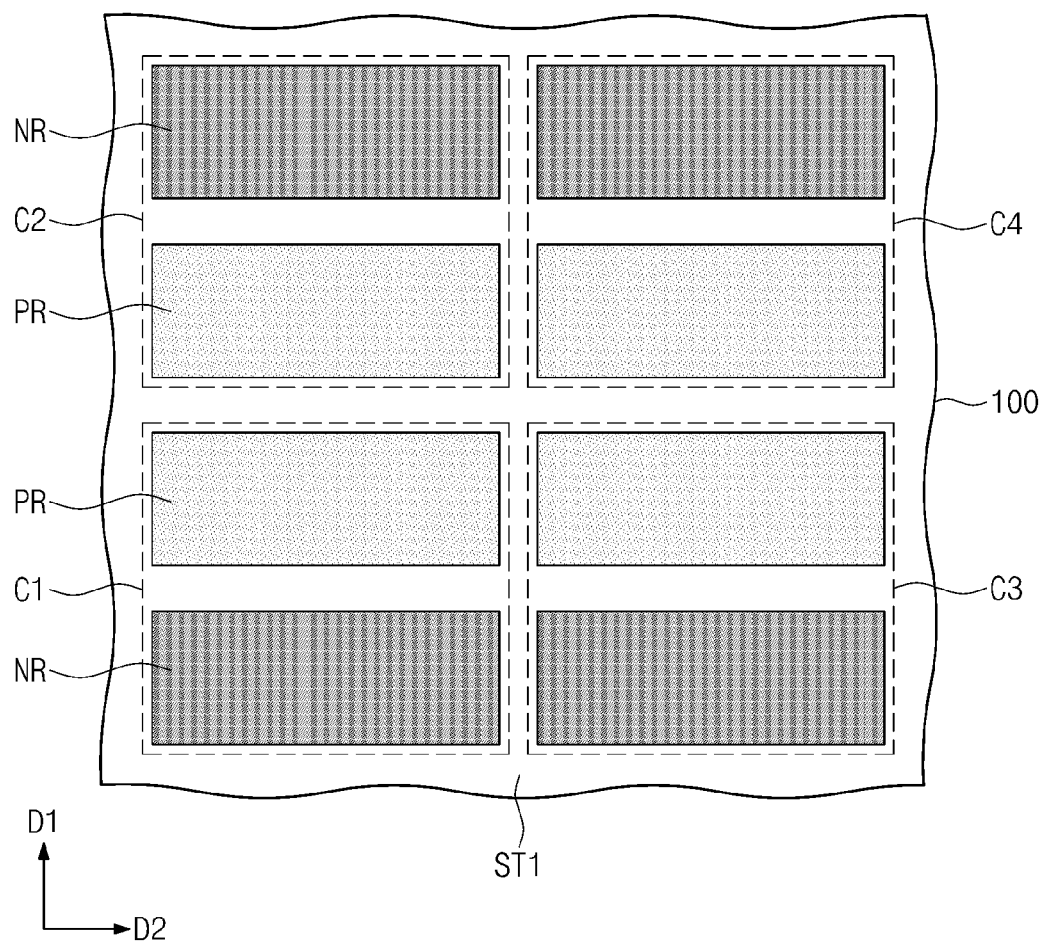
FIG. 1 is a plan view of a semiconductor device according to an example embodiment.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a semiconductor device according to an example embodiment.

Referring to FIG. 1, a semiconductor device according to an example embodiment may include a plurality of logic cells C1, C2, C3, and C4 provided on a substrate. Each of the logic cells C1, C2, C3, and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 crossing the first direction D1, and a fourth logic cell C4 spaced apart from the second logic cell C2 in the second direction D2. Each of the logic cells C1, C2, C3, and C4 may include active regions separated apart from each other by a first device isolation layer ST1. Each of the logic cells C1, C2, C3, and C4 may include a PMOSFET region PR and an NMOSFET region NR separated apart from each other by the first device isolation layer ST1.

As an example, the PMOSFET and NMOSFET regions PR and NR may be spaced apart from each other in the first direction D1. The PMOSFET region PR of the first logic cell C1 may be spaced apart from the PMOSFET region PR of the second logic cell C2 in the first direction D1. In the description below, a logic cell may refer to a unit configured to perform a logical operation, and the first logic cell C1 will be described as an example of the logic cell. Further, the number of the logic cells may be variously changed from that illustrated in the drawing.

Figure 2:
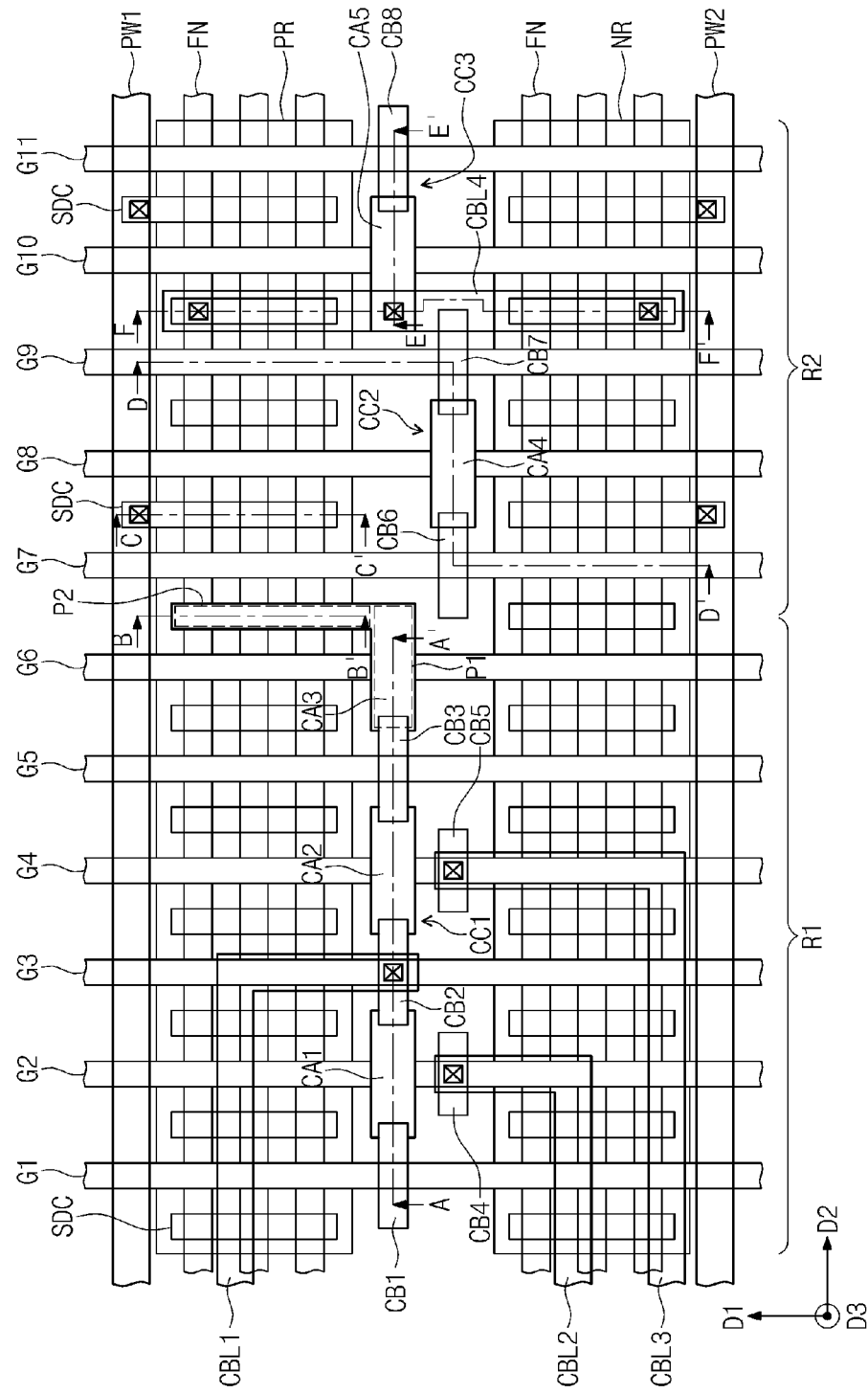
FIG. 2 is a plan view of a first logic cell of FIG. 1, which is illustrated to provide a description of a semiconductor device according to an example embodiment.

FIG. 2 is a plan view of the first logic cell C1 of FIG. 1, which is illustrated to provide a description of a semiconductor device according to an example embodiment. FIGS. 3A through 3F are sectional views taken along lines A-A', B-B', C-C', D-D', E-E', and F-F', respectively, of FIG. 2. Hereinafter, various example embodiments will be described with reference to the first logic cell C1 of FIG. 1, but the other logic cells may have substantially the same or similar structure or configuration as that of the first logic cell C1.

Referring to FIGS. 2 and 3A through 3F, the first device isolation layer ST1 may be provided on a substrate 100 to define the PMOSFET and NMOSFET regions PR and NR. Further, the first logic cell C1 may be isolated from neighboring logic cells C2, C3, and C4 by the first device isolation layer ST1. The first device isolation layer ST1 may be formed in an upper portion of the substrate 100. In some example embodiments, the substrate 100 may be a silicon substrate, a germanium substrate, or a silicon-on-insulator (SOI) substrate.

The PMOSFET and NMOSFET regions PR and NR may be spaced apart from each other, in a first direction D1 parallel to a top surface of the substrate 100, with the first device isolation layer ST1 being interposed therebetween. Although each of the PMOSFET and NMOSFET regions PR and NR is shown to be a single region, each PMOSFET and/or NMOSFET region PR and/or NR may be formed to include a plurality of regions separated apart from each other by the first device isolation layer ST1.

A plurality of active patterns FN may be provided on the PMOSFET and NMOSFET regions PR and NR to extend parallel to a second direction D2 crossing the first direction D1. The active patterns FN may be arranged along the first direction D1. Second device isolation layers ST2 may be provided at both sides of each of the active patterns FN to extend parallel to the second direction D2. In example embodiments, each of the active patterns FN may include a fin-shaped portion. As an example, a fin-shaped portion of the active pattern FN may be positioned between the second device isolation layers ST2 and may have a fin shape protruding upward relative to the second device isolation layers ST2.

Although the number of the active patterns FN provided on each of the PMOSFET and NMOSFET regions PR and NR is shown to be three in FIG. 2, example embodiments are not limited thereto. The first device isolation layer ST1 may be connected to the second device isolation layers ST2 to form a single continuous insulating layer. In certain example embodiments, the first device isolation layer ST1 may have a thickness greater than that of the second device isolation layers ST2. In this case, the second device isolation layers ST2 may be formed by a process separate from that for the first device isolation layer ST1. In other example embodiments, the second device isolation layers ST2 may be formed by the same process as that for the first device isolation layer ST1, thereby having substantially the same thickness as that of the first device isolation layer ST1. The first and second device isolation layers ST1 and ST2 may be positioned in the upper portion of the substrate 100. As an example, the first and second device isolation layers ST1 and ST2 may include a silicon oxide layer.

The first logic cell C1 may include a first circuit region R1 and a second circuit region R2. Each of the first and second circuit regions R1 and R2 may include the PMOSFET and NMOSFET regions PR and NR. As an example, the first circuit region R1 may be a part of a multiplexer (MUX) cell, and the second circuit region R2 may be a part of a flip-flop cell.

Gate electrodes G1-G11 may be provided on the active patterns FN to cross the active patterns FN and extend parallel to the first direction D1. The gate electrodes G1-G11 may include first to sixth gate electrodes G1-G6 provided on the first circuit region R1 and seventh to eleventh gate electrodes G7-G11 provided on the second circuit region R2. The gate electrodes G1-G11 may be spaced apart from each other in the second direction D2.

Each of the gate electrodes G1-G11 may extend parallel to the first direction D1, thereby crossing the PMOSFET and NMOSFET regions PR and NR. A gate insulating pattern GI may be provided at a lower portion of each of the gate electrodes G1-G11, and a capping pattern GP may be provided at an upper portion of each of the gate electrodes G1-G11. Gate spacers GS may be provided on both sidewalls of each of the gate electrodes G1-G11. First to fourth interlayered insulating layers 110, 120, 130, and 140 may be provided to cover the gate electrodes G1-G11.

The gate electrodes G1-G11 may include at least one of doped semiconductors, metals, or conductive metal nitrides. The gate insulating pattern GI may include at least one of a silicon oxide layer, a silicon oxynitride layer, and a high-k dielectric layer whose dielectric constant is higher than that of a silicon oxide layer. At least one of the capping pattern GP and the gate spacers GS may include at least one of a silicon oxide layer, a silicon nitride layer, and a silicon oxynitride layer. Each of the first to fourth interlayered insulating layers 110, 120, 130, and 140 may include a silicon oxide layer or a silicon oxynitride layer.

Figure 3A:
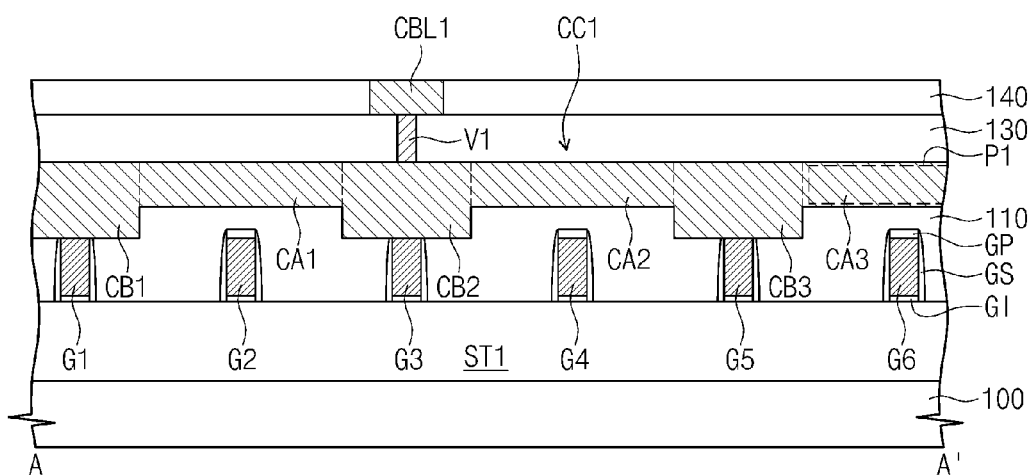
FIGS. 3A through 3F are sectional views taken along lines A-A', B-B', C-C', D-D', E-E', and F-F', respectively, of FIG. 2.
Figure 3B:
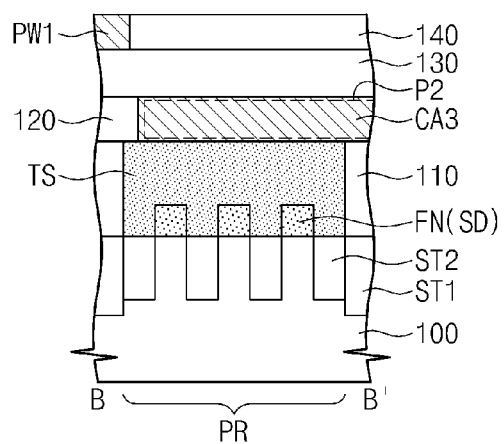
Figure 3C:
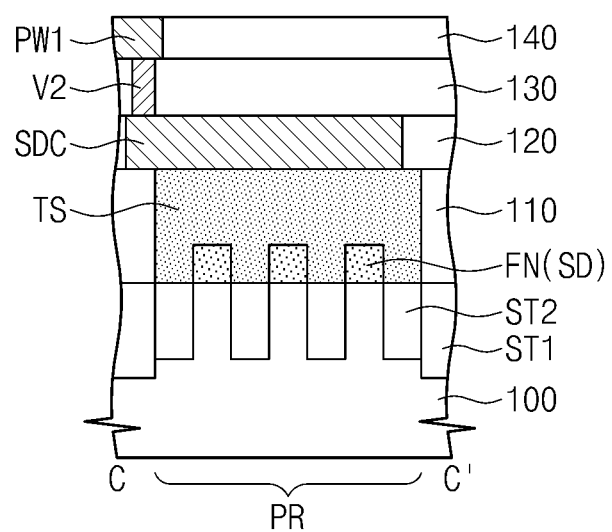
Figure 3D:
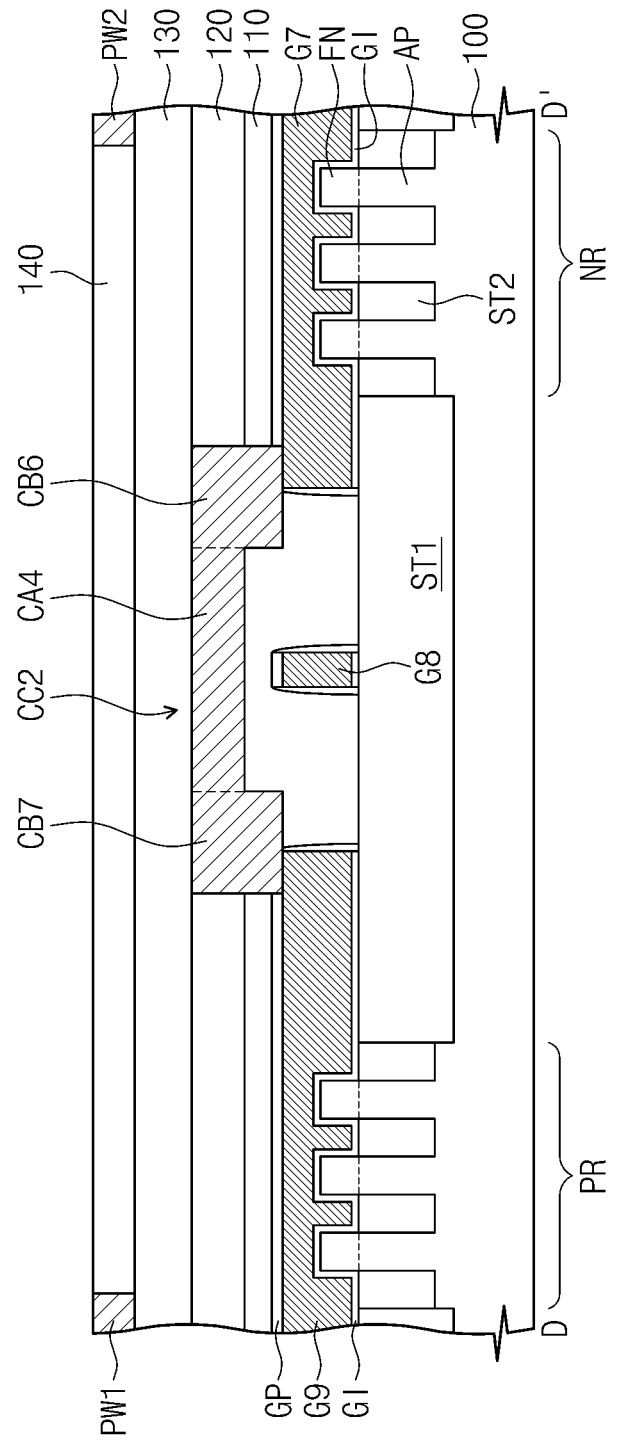
Figure 3E:
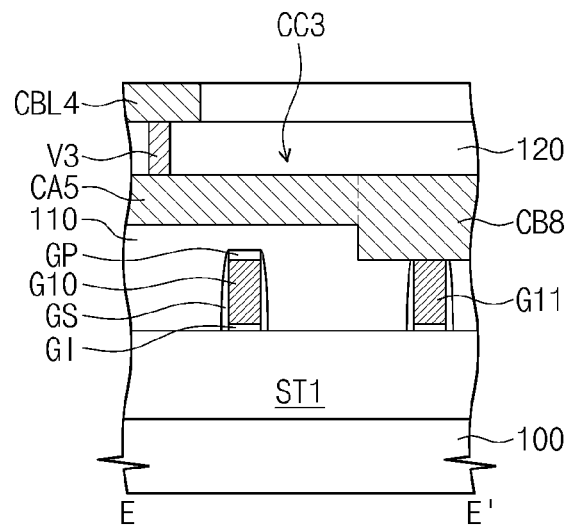
Figure 3F:
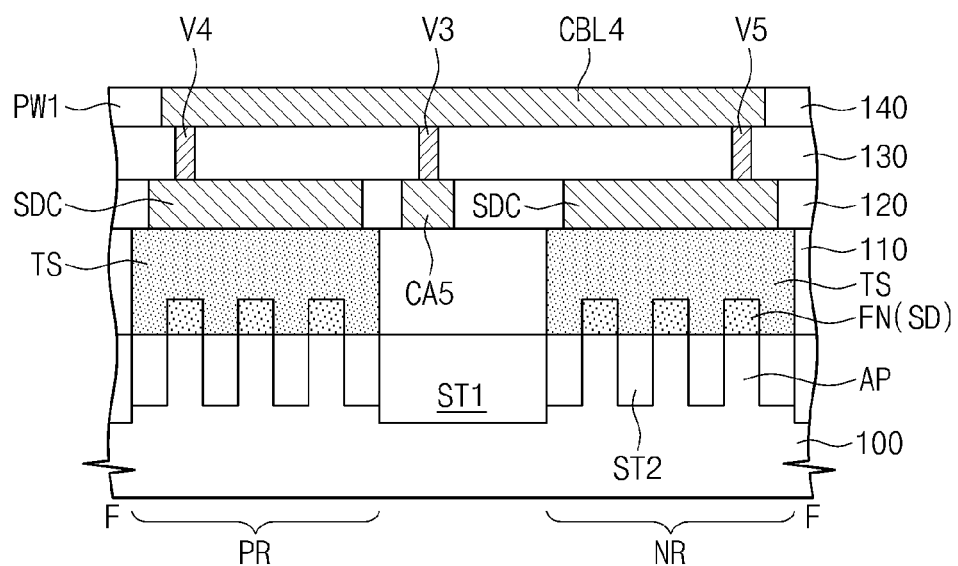

Source/drain regions SD may be provided in portions of the active patterns FN positioned at both sides of each of the gate electrodes G1-G11. The source/drain regions SD may be locally formed in the active patterns FN, as shown in FIGS. 3B, 3C and 3F, but in certain embodiments, the source/drain regions SD may extend into an upper portion of the substrate 100 (e.g., in between the second device isolation layers ST2). The source/drain regions SD in the PMOSFET region PR may be p-type impurity regions, and the source/drain regions SD in the NMOSFET region NR may be n-type impurity regions. The fin-shaped portions of the active patterns FN, which are positioned below the gate electrodes G1-G11 and are overlapped with the gate electrodes G1-G11, may serve as channel regions of transistors.

In example embodiments, conductive connection patterns TS may be provided at both sides of each of the gate electrodes G1-G11. In the PMOSFET region PR, the source/drain regions SD, which are spaced apart from each other in the first direction D1 by the second device isolation layers ST2 interposed therebetween, may be electrically connected to each other through the conductive connection patterns TS. In other words, the conductive connection patterns TS may be provided to cover all of the active patterns FN thereunder and connect the source/drain regions SD, which are separated from each other in the first direction D1, to each other. The conductive connection patterns TS may be in direct contact with the source/drain regions SD. The conductive connection patterns TS may include at least one of metal silicide materials. As an example, the conductive connection patterns TS may include at least one of titanium silicide, tantalum silicide, and tungsten silicide. The conductive connection patterns TS may further include a metal layer. The metal layer may include at least one of, for example, titanium, tantalum, and tungsten. As an example, the conductive connection patterns TS may include a metal-silicide layer and a metal layer on the metal-silicide layer.

The source/drain regions SD in the NMOSFET region NR may also be connected to each other by the conductive connection patterns TS in a similar manner. In other words, in the NMOSFET region NR, the source/drain regions SD, which are spaced apart from each other in the first direction D1 by the second device isolation layers ST2 interposed therebetween, may be electrically connected to each other through the conductive connection patterns TS. The conductive connection patterns TS may be provided in the first interlayered insulating layer 110.

Source/drain contacts SDC may be provided on the conductive connection patterns TS. As an example, when viewed in a plan view, the source/drain contacts SDC may be provided at both sides of each of the gate electrodes G1-G11. Each of the source/drain contacts SDC may have a shape, such as a bar covering a top surface of the conductive connection pattern TS and extending parallel to the first direction D1. Although not shown, some of the source/drain contacts SDC may be extended over the first device isolation layer ST1 to connect the source/drain regions SD of the PMOSFET region PR to the source/drain regions SD of the NMOSFET region NR.

The source/drain contacts SDC may include at least one of doped semiconductors, metals, and conductive metal nitrides. Here, the conductive connection patterns TS may include a material different from that of the source/drain contacts SDC. As an example, the source/drain contacts SDC may include tungsten, while the conductive connection patterns TS may include a metal silicide.

The first logic cell C1 may include a first wire PW1 provided outside the PMOSFET region PR and a second wire PW2 provided outside the NMOSFET region NR. In example embodiments, the first wire PW1 on the PMOSFET region PR may serve as a pathway for delivering a drain voltage (Vdd) or a power voltage. The second wire PW2 on the NMOSFET region NR may serve as a pathway for delivering a source voltage (Vss) or a ground voltage.

The first and second wires PW1 and PW2 may extend parallel to the second direction D2 and may be shared by logic cells adjacent to each other in the second direction D2. As an example, the first wire PW1 may be shared by the first and third logic cells C1 and C3. Further, the first wire PW1 may be shared by the PMOSFET regions PR, which are respectively provided in the first and second logic cells C1 and C2.

In example embodiments, a second via V2 may be provided on the PMOSFET region PR between the seventh and eighth gate electrodes G7 and G8 to be in contact with the source/drain contact SDC. Accordingly, the source/drain region SD between the seventh and eighth gate electrodes G7 and G8 may be electrically connected to the first wire PW1 through the conductive connection pattern TS, the source/drain contact SDC, and the second via V2. Similarly, the source/drain region SD on the NMOSFET region NR may be electrically connected to the second wire PW2.

Referring back to FIGS. 2, 3A, 3B, and 3C, a first connection contact CC1 may be provided on the first circuit region R1 to cross the first to sixth gate electrodes G1-G6. The first connection contact CC1 may have a shape, such as a bar extending parallel to the second direction D2. The first connection contact CC1 may be provided on the first device isolation layer ST1 and between the PMOSFET and NMOSFET regions PR and NR. The first connection contact CC1 may be provided in the second interlayered insulating layer 120, which is disposed on the first interlayered insulating layer 110.

The first connection contact CC1 may include first to third sub contacts CA1-CA3 and first to third gate contacts CB1-CB3. The first to third sub contacts CA1-CA3 and the first to third gate contacts CB1-CB3 may be alternately arranged on the first to sixth gate electrodes G1-G6. For example, the first to third gate contacts CB1-CB3 may be provided on the first, third, and fifth gate electrodes G1, G3, and G5, respectively, and the first to third sub contacts CA1-CA3 may be provided on the second, fourth, and sixth gate electrodes G2, G4, and G6, respectively.

The first to third sub contacts CA1-CA3 may be provided on the first interlayered insulating layer 110. Accordingly, the first to third sub contacts CA1-CA3 may be spaced apart from top surfaces of the second, fourth, and sixth gate electrodes G2, G4, and G6 in a vertical direction (i.e., direction perpendicular to the first and second directions D1 and D2). The first to third gate contacts CB1-CB3 may be provided to penetrate the first interlayered insulating layer 110 and to be in contact with the top surfaces of the first, third, and fifth gate electrodes G1, G3, and G5, respectively. When viewed in a sectional view, the first to third sub contacts CA1-CA3 and the first to third gate contacts CB1-CB3 may have top surfaces positioned at substantially the same level. However, bottom surfaces of the first to third sub contacts CA1-CA3 may be positioned at a higher level than bottom surfaces of the first to third gate contacts CB1-CB3. Further, the first to third sub contacts CA1-CA3 may be provided at substantially the same level as the source/drain contacts SDC. For example, the first to third sub contacts CA1-CA3 may have bottom and top surfaces positioned at substantially the same levels as the bottom and top surfaces of the source/drain contacts SDC. In example embodiments, the first to third sub contacts CA1-CA3 may be simultaneously formed with the source/drain contacts SDC.

The first to third sub contacts CA1-CA3 and the first to third gate contacts CB1-CB3 may include substantially the same material and may be connected to each other to constitute the first connection contact CC1 provided in a single body. The first to third sub contacts CA1-CA3 and the first to third gate contacts CB1-CB3 may include at least one of doped semiconductors, metals, and conductive metal nitrides. As an example, the first to third sub contacts CA1-CA3 and the first to third gate contacts CB1-CB3 may include the same material as that of the source/drain contacts SDC.

In example embodiments, the third sub contact CA3 may include a first portion P1 extending in the second direction D2 and a second portion P2 extending in the first direction D1. When viewed in a plan view, the first portion P1 may be disposed to cross the sixth gate electrode G6. The second portion P2 may be extended from an end portion of the first portion P1 toward the PMOSFET region PR. As an example, the second portion P2 may be overlapped with any one of the conductive connection patterns TS formed on the PMOSFET region PR, when viewed in a plan view. The second portion P2 may be in contact with a top surface of the any one of the conductive connection patterns TS. Thus, the third sub contact CA3 may be connected to the source/drain regions SD between the sixth and seventh gate electrodes G6 and G7 through the second portion P2 and the any one of the conductive connection pattern TS.

A first conductive line CBL1 may be provided on the first connection contact CC1. A first via V1 may be disposed between the first connection contact CC1 and the first conductive line CBL1. The first conductive line CBL1 may be electrically connected to the first connection contact CC1 via the first via V1. That is, it is possible to establish a signal path for exchanging signals between the first conductive line CBL1 and the first connection contact CC1. The third and fourth interlayered insulating layers 130 and 140 may be sequentially stacked on the second interlayered insulating layer 120. The first via V1 may be provided in the third interlayered insulating layer 130, and the first conductive line CBL1 may be provided in the fourth interlayered insulating layer 140.

In example embodiments, the second and fourth gate electrodes G2 and G4 may be in contact with fourth and fifth gate contacts CB4 and CB5, respectively. Second and third conductive lines CBL2 and CBL3 may be provided on the second and fourth gate electrodes G2 and G4, respectively. The second gate electrode G2 may be connected to the second conductive line CBL2 through the fourth gate contact CB4 and a via (not shown), and the fourth gate electrode G4 may be connected to the third conductive line CBL3 through the fifth gate contact CB5 and a via (not shown).

The first connection contact CC1 may be connected to the first, third and fifth gate electrodes G1, G3, and G5 through the first to third gate contacts CB1-CB3. Accordingly, the first, third and fifth gate electrodes G1, G3, and G5 may be in an equipotential state. For example, the first connection contact CC1 may be used to apply the same signal to the first, third and fifth gate electrodes G1, G3, and G5, and not to the second, fourth and sixth gate electrodes G2, G4, and G6. Further, the first connection contact CC1 may be used to apply the same signal to the source/drain regions SD through the second portion P2 of the third sub contact CA3.

In addition, the first to third sub contacts CA1-CA3 of the first connection contact CC1 may be positioned at the same level as the source/drain contacts SDC to serve as bridges connecting the first to third gate contacts CB1-CB3 to each other. Thus, additional vias and conductive lines for connecting the first to third gate contacts CB1-CB3 to each other may not be needed. Since, as described above, the first to third sub contacts CA1-CA3 may be formed along with the source/drain contacts SDC, the first to third sub contacts CA1-CA3 may be formed without an additional process. As a result, in the case where the first connection contact CC1 according to example embodiments is provided, it is possible to simplify a process for fabricating a semiconductor device and increase an integration density of a semiconductor device.

The afore-described structure of the first connection contact CC1 may be an example of various structures of the first connection contact CC1, and example embodiments are not limited thereto. In other words, although three gate contacts (e.g., the first to third gate contacts CB1-CB3) and three sub contacts (e.g., the first to third sub contacts CA1-CA3) are shown, example embodiments are not limited thereto. Further, at least one of the first to third sub contacts CA1-CA3 may be extended in the second direction D2 to cross two or more gate electrodes.

Referring to FIGS. 2, 3D, 3E, and 3F, a second connection contact CC2 may be provided on the second circuit region R2 to cross the seventh to ninth gate electrodes G7-G9. Further, a third connection contact CC3 may be provided to cross the tenth and eleventh gate electrodes G10 and G11. The second and third connection contacts CC2, CC3 may have a shape such as a bar extending parallel to the second direction D2. The second and third connection contacts CC2 and CC3 may be provided on the first device isolation layer ST1 between the PMOSFET and NMOSFET regions PR and NR. Each of the second and third connection contacts CC2 and CC3 may be provided to have a structure similar to that of the first connection contact CC1 previously described, and thus, for a concise description, a difference between the second and third connection contacts CC2 and CC3 and the first connection contact CC1 will be mainly explained below.

The second connection contact CC2 may include a fourth sub contact CA4 and sixth and seventh gate contacts CB6 and CB7 provided at both end portions of the fourth sub contact CA4. The sixth and seventh gate contacts CB6 and CB7 may be disposed on the seventh and ninth gate electrodes G7 and G9, respectively, and the fourth sub contact CA4 may be disposed on the eighth gate electrode G8. Here, the sixth and seventh gate contacts CB6 and CB7 may penetrate the first interlayered insulating layer 110 and may be in contact with the top surfaces of the seventh and ninth gate electrodes G7 and G9. The fourth sub contact CA4 may be spaced apart from a top surface of the eighth gate electrode G8 in the vertical direction.

The second connection contact CC2 may be connected to the seventh and ninth gate electrodes G7 and G9 through the sixth and seventh gate contacts CB6 and CB7. Accordingly, the seventh and ninth gate electrodes G7 and G9 may be in an equipotential state. Although not shown, a via (not shown) and a conductive line (not shown) may be provided on the second connection contact CC2, similar to the first connection contact CC1 described with reference to FIG. 3A. Accordingly, the second connection contact CC2 may be used to selectively apply the same signal to the seventh and ninth gate electrodes G7 and G9, and not to the eighth gate electrode G8.

In example embodiments, the second connection contact CC2 and the seventh to ninth gate electrodes G7-G9 may be formed to have a cross-couple structure. The cross-couple structure may include first and second transistors provided on the PMOSFET region PR, third and fourth transistors provided on the NMOSFET region NR, and a connection structure connecting the first to fourth transistors in an intersecting manner. As an example, the eighth gate electrode G8 on the PMOSFET region PR may serve as a gate electrode of the first transistor, the ninth gate electrode G9 on the PMOSFET region PR may serve as a gate electrode of the second transistor, the seventh gate electrode G7 on the NMOSFET region NR may serve as a gate electrode of the third transistor, and the eighth gate electrode G8 on the NMOSFET region NR may serve as a gate electrode of the fourth transistor. Here, the first and fourth transistors may be connected to each other by sharing the eighth gate electrode G8 as a common gate, and the second and third transistors may be connected to each other through the second connection contact CC2. Accordingly, a first signal may be applied in common to the gate electrodes of the first and fourth transistors through the eighth gate electrode G8, and a second signal may be applied in common to the gate electrodes of the second and third transistors through the second connection contact CC2.

The third connection contact CC3 may include a fifth sub contact CA5 and an eighth gate contact CB8 provided at one of end portions of the fifth sub contact CA5. The eighth gate contact CB8 may be disposed on the eleventh gate electrode G11, and the fifth sub contact CA5 may be disposed on the tenth gate electrode G10. Here, the eighth gate contact CB8 may penetrate the first interlayered insulating layer 110 and may be in contact with a top surface of the eleventh gate electrode G11. The fifth sub contact CA5 may be spaced apart from a top surface of the tenth gate electrode G10 in the vertical direction.

On an opposite end portion of the fifth sub contact CA5, a fourth conductive line CBL4 may be provided to cross the PMOSFET and NMOSFET regions PR and NR. The fourth conductive line CBL4 may shape such as a bar extending parallel to the first direction D1. A third via V3 may be disposed between the fifth sub contact CA5 and the fourth conductive line CBL4. The fourth conductive line CBL4 may be electrically connected to the third connection contact CC3 via the third via V3.

The fourth conductive line CBL4 may be connected to the top surface of the source/drain contact SDC on the PMOSFET region PR through a fourth via V4 and may be in contact with the top surface of the source/drain contact SDC on the NMOSFET region NR through a fifth via V5. In other words, the eleventh gate electrode G11 may be electrically connected to the source/drain regions SD between the ninth and tenth gate electrode G9 and G10 through the third connection contact CC3. According to example embodiments, by using the third connection contact CC3, it may be possible to provide a shortest path electrically connecting the eleventh gate electrode G11 to the source/drain regions SD, which is spaced apart from the eleventh gate electrode G11 with the tenth gate electrode G10 being interposed therebetween, without additional vias and additional conductive lines.

In example embodiments, the third connection contact CC3, the eleventh gate electrode G11, and the source/drain regions SD between the ninth and tenth gate electrode G9 and G10 may serve as a buffer cell.

Figure 9A:
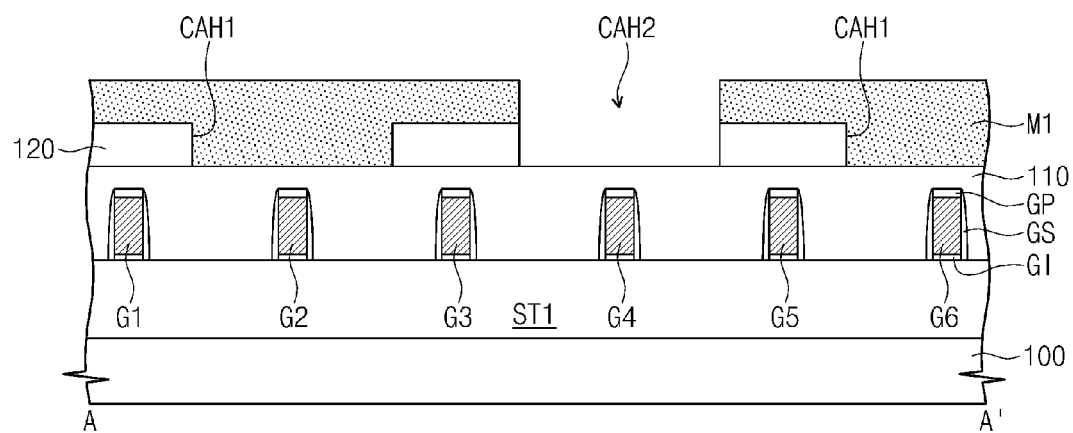
Figure 9B:
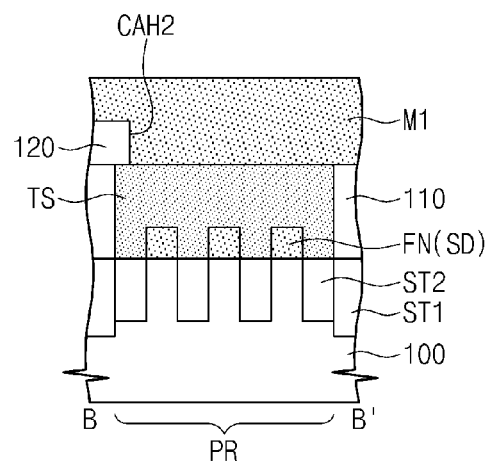
Figure 9C:
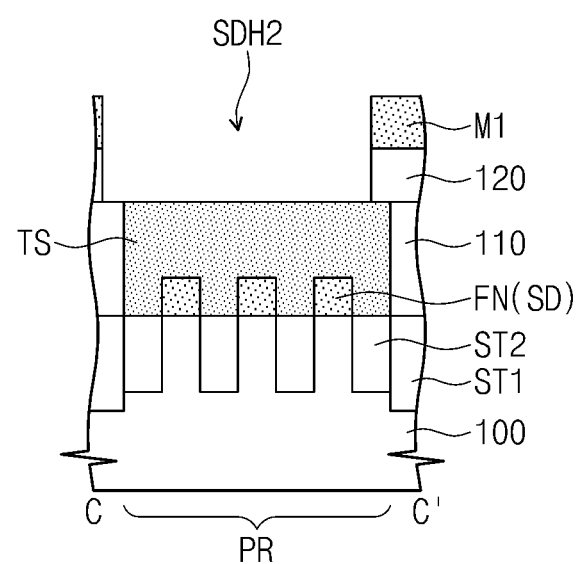
FIGS. 9C and 11C are sectional views taken along line C-C' of FIGS. 8 and 10, respectively.
Figure 9D:
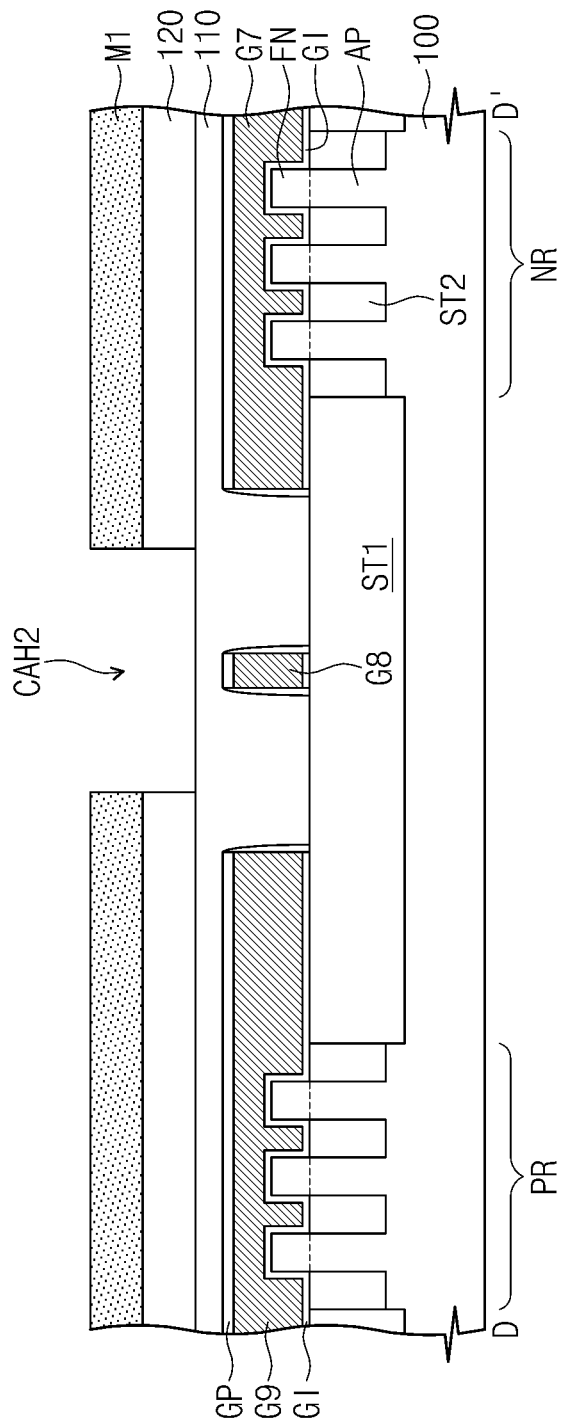
FIGS. 9D and 11D are sectional views taken along line D-D' of FIGS. 8 and 10, respectively.
Figure 9E:
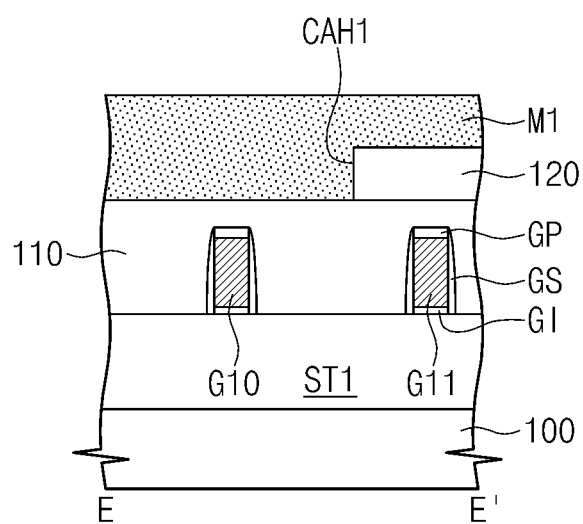
FIGS. 9E and 11E are sectional views taken along line E-E' of FIGS. 8 and 10, respectively.
Figure 10:
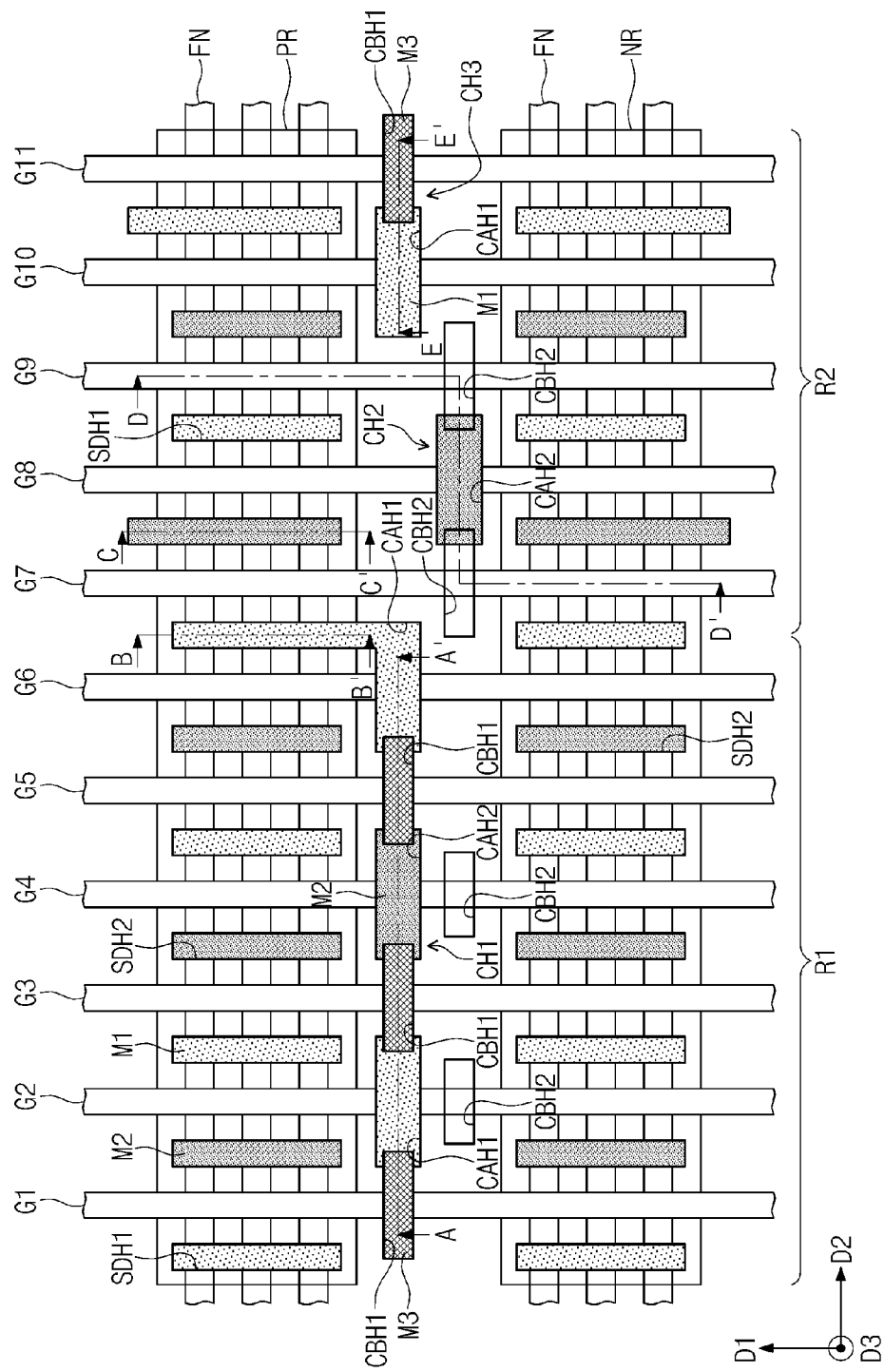
Figure 11A:
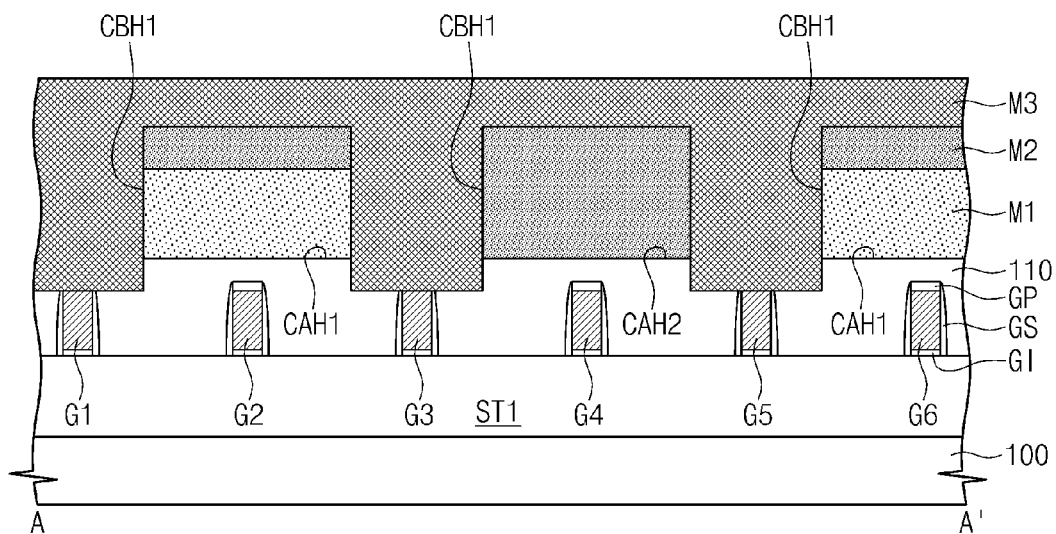
Figure 11B:
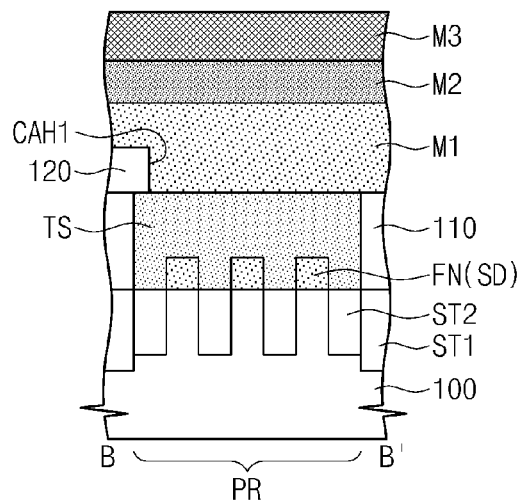
Figure 11C:
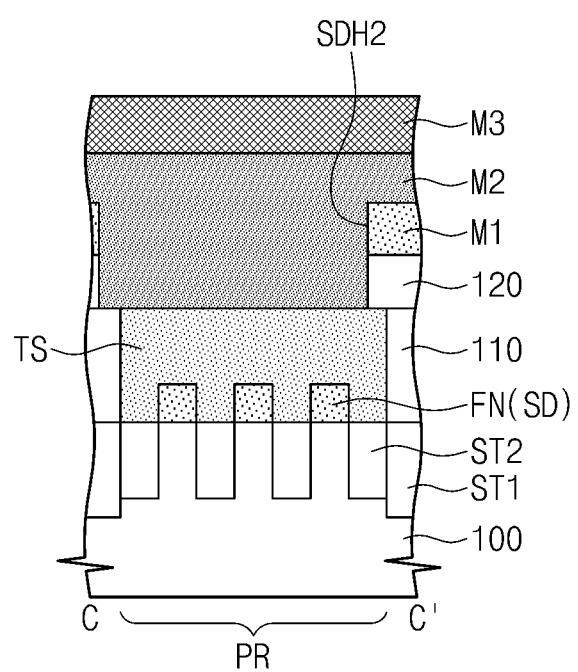
Figure 11D:
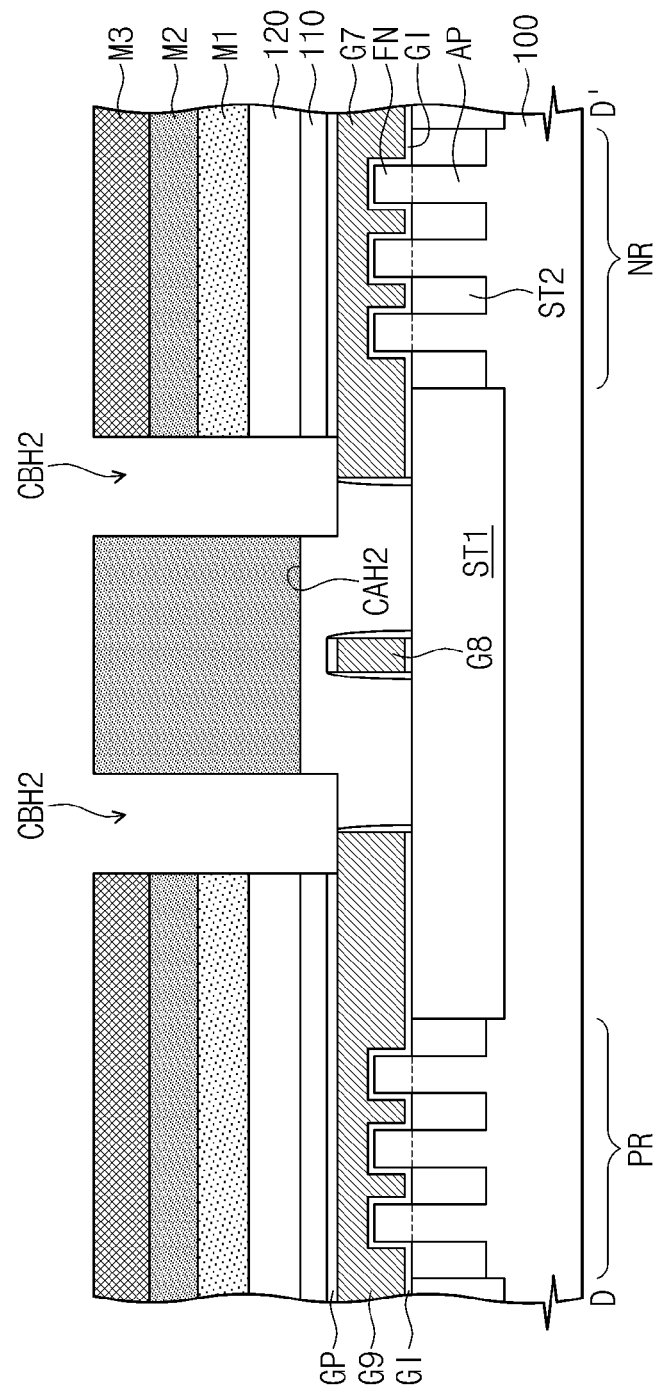
Figure 11E:
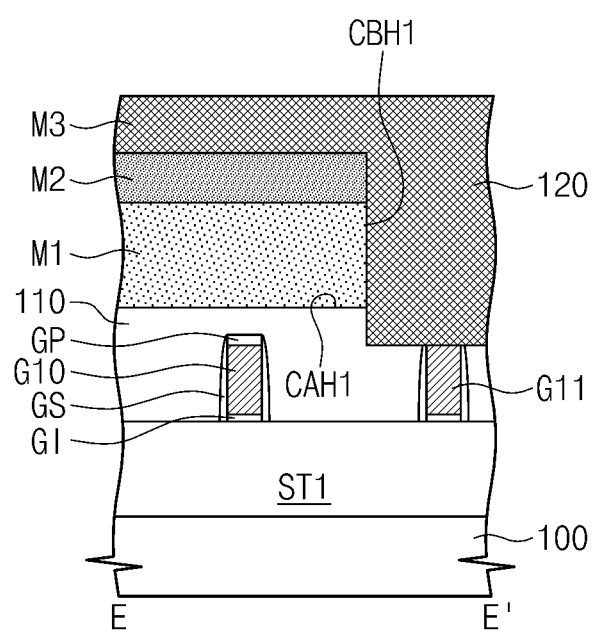

FIGS. 4, 6, 8, and 10 are plan views of the first logic cell C1 of FIG. 1, which are illustrated to provide a description of a method of fabricating a semiconductor device according to example embodiments. FIGS. 5A, 7A, 9A, and 11A are sectional views taken along line A-A' of FIGS. 4, 6, 8, and 10, respectively, FIGS. 5B, 7B, 9B, and 11B are sectional views taken along line B-B' of FIGS. 4, 6, 8, and 10, respectively, FIGS. 9C and 11C are sectional views taken along line C-C' of FIGS. 8 and 10, respectively, FIGS. 9D and 11D are sectional views taken along line D-D' of FIGS. 8 and 10, respectively, and FIGS. 9E and 11E are sectional views taken along line E-E' of FIGS. 8 and 10, respectively.

Figure 4:
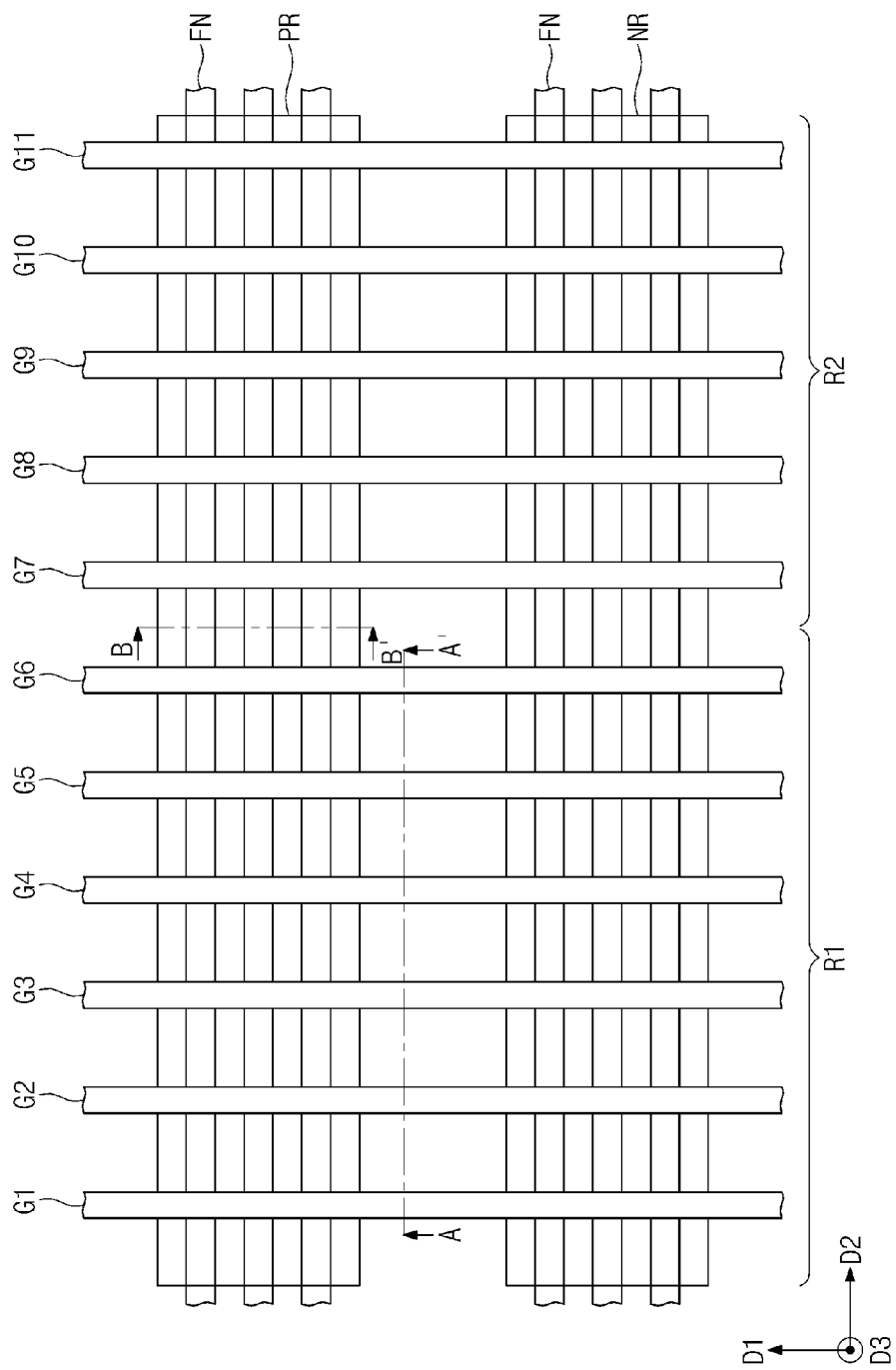
Figure 5A:
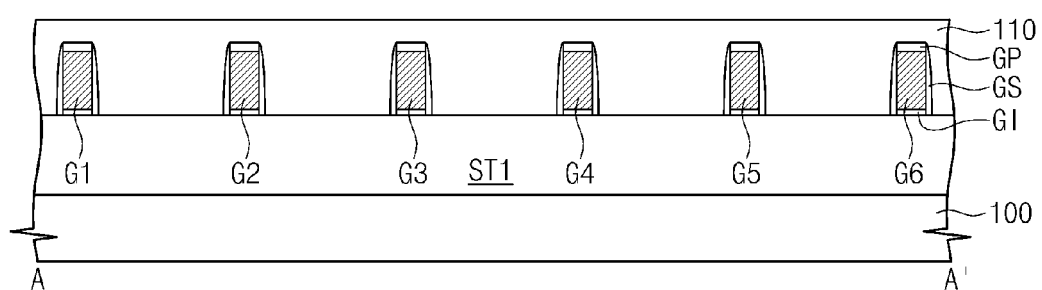
FIGS. 5A, 7A, 9A, and 11A are sectional views taken along line A-A' of FIGS. 4, 6, 8, and 10, respectively.
Figure 5B:
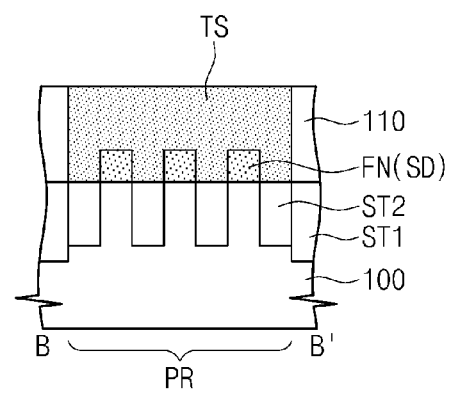
FIGS. 5B, 7B, 9B, and 11B are sectional views taken along line B-B' of FIGS. 4, 6, 8, and 10, respectively.

Referring to FIGS. 4, 5A, and 5B, the first device isolation layer ST1 may be formed on the substrate 100 to define the PMOSFET region PR and the NMOSFET region NR. The second device isolation layers ST2 may be formed to define a plurality of active patterns FN on each of the PMOSFET and NMOSFET regions PR and NR. In some example embodiments, the substrate 100 may be a silicon substrate, a germanium substrate, or a silicon-on-insulator (SOI) substrate. The first and second device isolation layers ST1 and ST2 may be formed by a shallow-trench isolation (STI) process and may include, for example, a silicon oxide layer.

In example embodiments, the second device isolation layers ST2 may have a depth smaller than that of the first device isolation layer ST1. Here, the depths of the first and second device isolation layers ST1 and ST2 are to be measured in a third direction D3 perpendicular to the first and second directions D1 and D2. For example, the third direction D3 may be perpendicular to the top surface of the substrate 100. In this case, the second device isolation layers ST2 may be formed by a process separate from that for the first device isolation layer ST1. As another example, the second device isolation layers ST2 may be concurrently formed with the first device isolation layer ST1 and may have substantially the same depth as that of the first device isolation layer ST1.

The active patterns FN may include fin-shaped portions, which are provided between the second device isolation layers ST2 extending in the second direction D2 to have top surfaces protruding relative to those of the second device isolation layers ST2. The active patterns FN may also extend parallel to the second direction D2.

The gate electrodes G1-G11 may be formed on the substrate 100 to cross the active patterns FN and extend parallel to the first direction D1. The gate electrodes G1-G11 may include the first to sixth gate electrodes G1-G6 formed on the first circuit region R1 of the first logic cell C1 and the seventh to eleventh gate electrodes G7-G11 formed on the second circuit region R2. The gate electrodes G1-G11 may be spaced apart from each other in the second direction D2.

The gate insulating pattern G1 may be formed between each of the gate electrodes G1-G11 and the substrate 100. The capping pattern GP may be formed on each of the gate electrodes G1-G11. The formation of the gate electrodes G1-G11, the gate insulating pattern G1, and the capping pattern GP may include forming a gate insulating layer, a gate layer, and a capping layer on the substrate 100 and performing a patterning process thereon. The gate insulating layer may include at least one of a silicon oxide layer, a silicon oxynitride layer, and a high-k dielectric layer whose dielectric constant is higher than that of a silicon oxide layer. The gate layer may include at least one of doped semiconductors, metals, and conductive metal nitrides. The capping layer may include at least one of a silicon oxide layer, a silicon nitride layer, and a silicon oxynitride layer. Each of the gate insulating layer, the gate layer, and the capping layer may be formed by at least one of a chemical vapor deposition process and a sputtering process. In addition, the gate spacers GS may be formed at both sides of each of the gate electrodes G1-G11. The gate spacers GS may be formed by forming a spacer layer to cover the gate electrodes G1-G11 and anisotropically etching the spacer layer. The spacer layer may include at least one of a silicon oxide layer, a silicon nitride layer, and a silicon oxynitride layer.

An ion implantation process may be performed on the resulting structure provided with the gate electrodes G1-G11 to form the source/drain regions SD. The source/drain regions SD may be formed in portions of the active patterns FN positioned at both sides of each of the gate electrodes G1-G11. The gate electrodes G1-G11 may be used as a mask pattern in the ion implantation process, and thus, the source/drain regions SD may be partially overlapped with or spaced apart from the gate electrodes G1-G11, when viewed in a plan view. The source/drain regions SD of the PMOSFET region PR may be formed to be of a p-type, and the source/drain regions SD of the NMOSFET region NR may be formed to be of an n-type.

The first interlayered insulating layer 110 may be formed on the substrate 100 to cover the gate electrodes G1-G11. The first interlayered insulating layer 110 may include at least one of a silicon oxide layer and a silicon oxynitride. The conductive connection patterns TS may be formed through the first interlayered insulating layer 110 and may be connected to the source/drain regions SD. The formation of the conductive connection patterns TS may include forming recess regions to penetrate the first interlayered insulating layer 110 and expose the active patterns FN at both sides of each of the gate electrodes G1-G11, forming a conductive material to fill the recess regions, and then, planarizing the conductive material to expose the first interlayered insulating layer 110. The conductive connection patterns TS may include at least one of metal silicide materials. As an example, the conductive connection patterns TS may include at least one of titanium silicide, tantalum silicide, and tungsten silicide. The conductive connection patterns TS may further include a metal layer. The metal layer may include at least one of, for example, titanium, tantalum, and tungsten. As an example, the conductive connection patterns TS may include a metal-silicide layer and a metal layer on the metal-silicide layer.

In the PMOSFET region PR, each of the conductive connection patterns TS may be formed to connect the source/drain regions SD, which are spaced apart from each other in the first direction D1 with the second device isolation layer ST2 being interposed therebetween, to each other. The source/drain regions SD of the NMOSFET region NR may be connected to each other by the conductive connection patterns TS in the same manner. For example, in the NMOSFET region NR, each of the conductive connection patterns TS may connect the source/drain regions SD, which are spaced apart from each other in the first direction D1 with the second device isolation layer ST2 being interposed therebetween, to each other. The conductive connection patterns TS may be formed to have top surfaces positioned at a higher level than those of the gate electrodes G1-G11.

Figure 6:
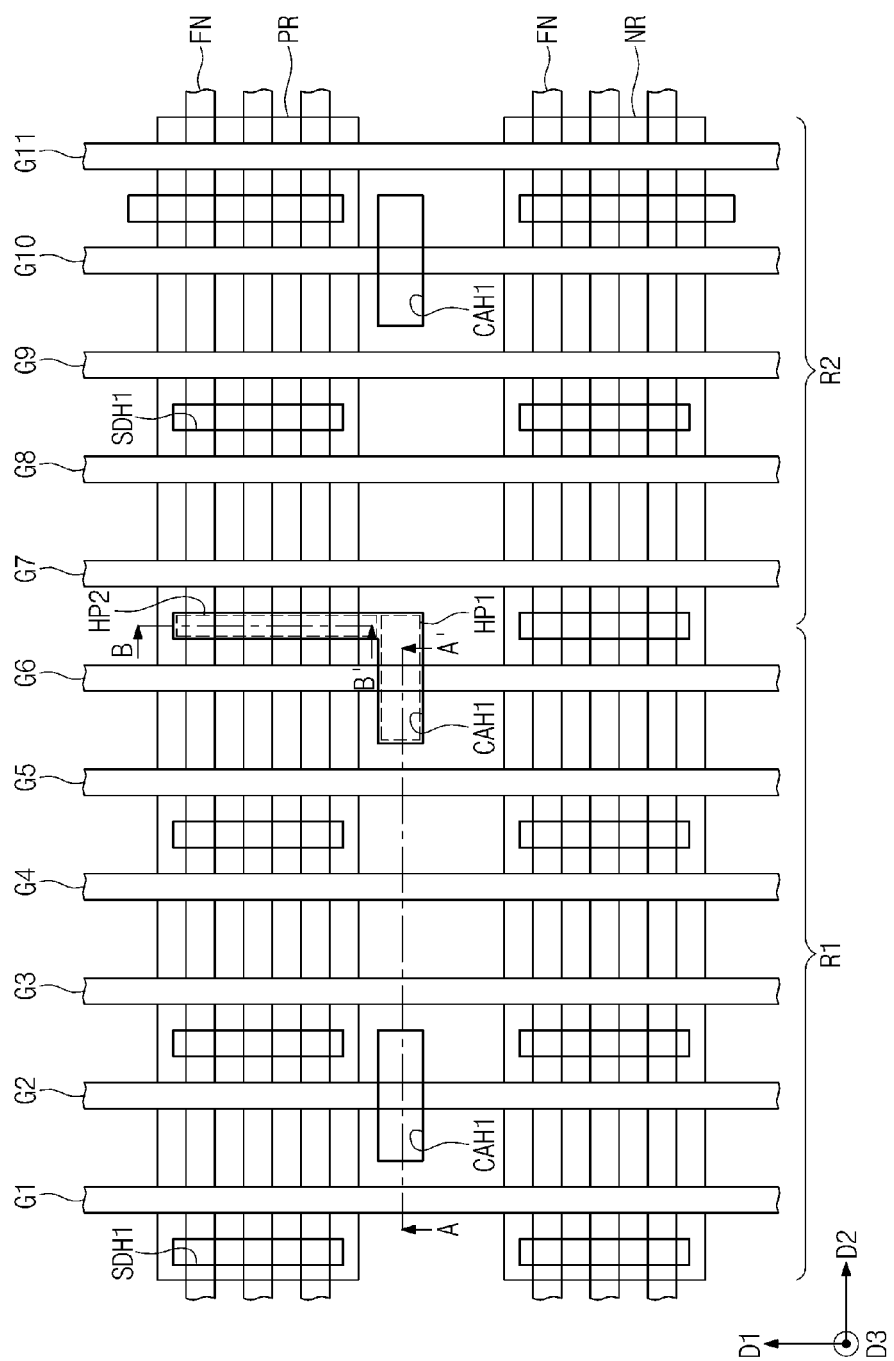
Figure 7A:
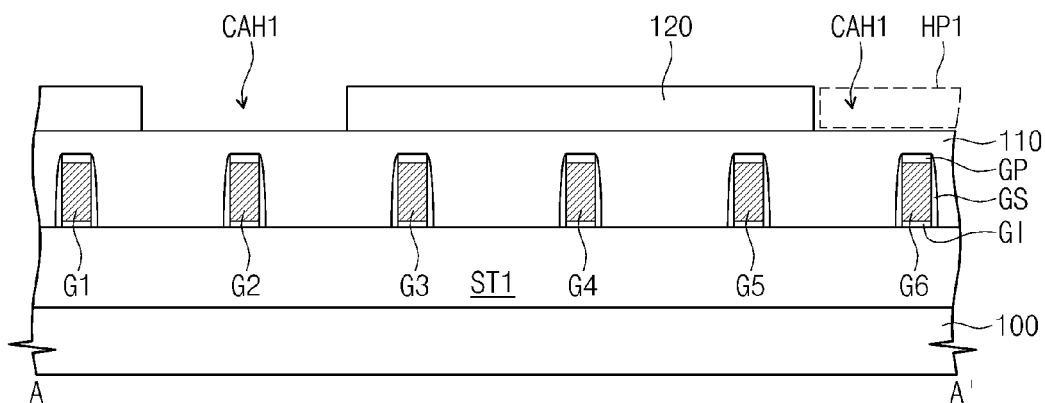
Figure 7B:
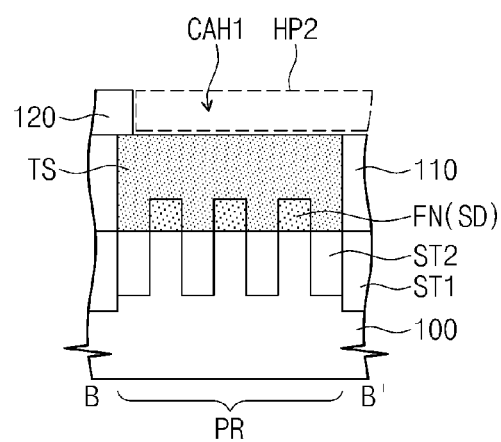

Referring to FIGS. 6, 7A, and 7B, the second interlayered insulating layer 120 may be formed on the resulting structure provided with the conductive connection patterns TS. The second interlayered insulating layer 120 may include a silicon oxide layer or a silicon oxynitride layer.

First sub contact holes CAH1 and first source/drain contact holes SDH1 may be formed by patterning the second interlayered insulating layer 120 using a first photomask (not shown). For example, a first photolithography process may be used to concurrently form the first sub contact holes CAH1 and the first source/drain contact holes SDH1. The patterning of the second interlayered insulating layer 120 may be performed to expose the top surfaces of the first interlayered insulating layer 110 and the conductive connection patterns TS.

In example embodiments, the first sub contact holes CAH1 may be formed on the second, sixth, and tenth gate electrodes G2, G6, and G10, respectively. The first source/drain contact holes SDH1 may be formed to expose the conductive connection patterns TS at a side of each of the gate electrodes G1-G11.

Further, the first sub contact holes CAH1 may be formed on the first device isolation layer ST1 between the PMOSFET and NMOSFET regions PR and NR. The first sub contact holes CAH1 may be extended in the second direction D2 to cross the second, sixth, and tenth gate electrodes G2, G6, and G10. The first source/drain contact holes SDH1 may be formed to extend in the first direction D1 or along the top surfaces of the conductive connection patterns TS.

In example embodiments, the first sub contact hole CAH1 on the sixth gate electrode G6 may include a first hole portion HP1 extending parallel to the second direction D2 and a second hole portion HP2 extending parallel to the first direction D1. When viewed in a plan view, the first hole portion HP1 may be formed to cross the sixth gate electrode G6. The second hole portion HP2 may be extended from an end portion of the first hole portion HP1 to be overlapped with the PMOSFET region PR. In example embodiments, the second hole portion HP2 may be formed to expose a top surface of any one of the conductive connection patterns TS formed on the PMOSFET region PR. For example, the second hole portion HP2 may be formed to expose the top surface of the conductive connection pattern TS between the sixth and seventh gate electrodes G6 and G7.

Referring to FIGS. 8 and 9A through 9E, a first mask layer M1 may be formed on the second interlayered insulating layer 120 to fill the first sub contact holes CAH1 and the first source/drain contact holes SDH1. The first mask layer M1 may include, for example, at least one of spin-on-hardmask (SOH) materials.

Second sub contact holes CAH2 and second source/drain contact holes SDH2 may be formed by patterning the first mask layer M1 using a second photomask (not shown). The second photomask may be a mask different from the first photomask. Here, the first and second photomasks may refer to different reticles. The second sub contact holes CAH2 and the second source/drain contact holes SDH2 may be concurrently formed by a second photolithography process. The second interlayered insulating layer 120 may be patterned during the patterning of the first mask layer M1. The patterning of the first mask layer M1 may be performed to expose the top surfaces of the first interlayered insulating layer 110 and the conductive connection patterns TS.

Although not shown, the first mask layer M1 may be formed to cover the entire region of the substrate 100, except for the second sub contact holes CAH2 and the second source/drain contact holes SDH2. However, in order to differentiate the first and second photomasks from each other, FIG. 8 shows the first mask layer M1 that is locally illustrated within only the first sub contact holes CAH1 and the first source/drain contact holes SDH1.

In example embodiments, the second sub contact holes CAH2 may be formed on the fourth and eighth gate electrodes G4 and G8, respectively. The second source/drain contact holes SDH2 may be formed to expose the conductive connection patterns TS at opposite sides of respective ones of the gate electrodes G1-G11.

Furthermore, the second sub contact holes CAH2 may be formed on the first device isolation layer ST1 between the PMOSFET and NMOSFET regions PR and NR. When viewed in a plan view, the second sub contact holes CAH2 may be respectively formed between the first sub contact holes CAH1, and the second source/drain contact holes SDH2 may be respectively formed between the first source/drain contact holes SDH1. In other words, the first and second sub contact holes CAH1 and CAH2 may be alternately formed using different photomasks, and the first and second source/drain contact holes SDH1 and SDH2 may also be alternately formed using different photomasks. Accordingly, it is possible to overcome limitation in minimum feature size of a photolithography process and provide a highly-integrated semiconductor device.

Except for the above described features, the second sub contact holes CAH2 and the second source/drain contact holes SDH2 may be similar to the first sub contact holes CAH1 and the first source/drain contact holes SDH1, respectively, that are previously described with reference to FIGS. 6, 7A, and 7B.

Referring to FIGS. 10 and 11A through 11E, a second mask layer M2 may be formed on the first mask layer M1 to fill the second sub contact holes CAH2 and the second source/drain contact holes SDH2. The second mask layer M2 may include, for example, at least one of spin-on-hardmask (SOH) materials.

First gate contact holes CBH1 may be formed by patterning the second mask layer M2 using a third photomask (not shown). The third photomask may differ from the first and second photomasks. In other words, the first gate contact holes CBH1 may be formed by a third photolithography process. When the patterning of the second mask layer M2 is performed, the first mask layer M1 and the second interlayered insulating layer 120 may be patterned along with the second mask layer M2. The patterning of the second mask layer M2 may be performed to expose the top surfaces of the first, third, fifth, and eleventh gate electrodes G1, G3, G5, and G11.

The first gate contact holes CBH1 may be formed on the first device isolation layer ST1 between the PMOSFET and NMOSFET regions PR and NR. Further, on the first circuit region R1, the first gate contact holes CBH1 may be connected to the first and second sub contact holes CAH1 and CAH2. For example, a first communication hole CH1 may be formed on the first circuit region R1, and the first communication hole CH1 may include the first gate contact holes CBH1 and the first and second sub contact holes CAH1 and CAH2. As an example, the first communication hole CH1 may include three first gate contact holes CBH1, two first sub contact holes CAH1, and one second sub contact hole CAH2. When viewed in a plan view, the first communication hole CH1 may be formed to extend parallel to the second direction D2 and cross the first to sixth gate electrodes G1-G6. Also, on the second circuit region R2, the first gate contact hole CBH1 may be formed to be connected to the first sub contact hole CAH1 on the tenth gate electrode G10. In other words, a third communication hole CH3 may be formed on the second circuit region R2. When viewed in a plan view, the third communication hole CH3 may be formed to extend parallel to the second direction D2 and cross the tenth and eleventh gate electrodes G10 and G11.

Next, a third mask layer M3 may be formed on the second mask layer M2 to fill the first gate contact holes CBH1. The third mask layer M3 may include, for example, at least one of spin-on-hardmask (SOH) materials.

Second gate contact holes CBH2 may be formed by pattering the third mask layer M3 using a fourth photomask (not shown). The fourth photomask may differ from the first to third photomasks. In other words, the second gate contact holes CBH2 may be formed by a fourth photolithography process. When the patterning of the third mask layer M3 is performed, the first and second mask layers M1 and M2 and the second interlayered insulating layer 120 may be patterned along with the third mask layer M3. The patterning of the third mask layer M3 may be performed to expose the top surfaces of the second, fourth, seventh, and ninth gate electrodes G2, G4, G7, and G9.

Although not shown, the first to third mask layers M1, M2, and M3 may be formed to cover the entire region of the substrate 100, except for the second gate contact holes CBH2. However, in order to differentiate the first to fourth photomasks from each other, mask layers filling the holes respectively are illustrated in FIG. 10. For example, the second mask layer M2 is illustrated to be provided within the second sub contact holes CAH2 and the second source/drain contact holes SDH2, and the third mask layer M3 is illustrated to be provided within the first gate contact holes CBH1.

The second gate contact holes CBH2 may be formed on the first device isolation layer ST1 of the PMOSFET and NMOSFET regions PR and NR. When viewed in the second direction D2 and in a plan view, the second gate contact holes CBH2 may be formed between respective pairs of the first gate contact holes CBH1. For example, the first and second gate contact holes CBH1 and CBH2 may be alternately formed using, for example, different photomasks. Accordingly, it is possible to overcome limitation in minimum feature size of a photolithography process and provide a highly-integrated semiconductor device.

Further, the second gate contact holes CBH2 may be formed on the second circuit region R2 to be overlapped with and connected to both end portions of the second sub contact hole CAH2 on the eighth gate electrode G8. In other words, a second communication hole CH2 may be formed on the second circuit region R2, and the second communication hole CH2 may include the second gate contact holes CBH2 and the second sub contact hole CAH2. When viewed in a plan view, the second communication hole CH2 may be formed to extend parallel to the second direction D2 and cross the seventh to ninth gate electrodes G7-G9.

In example embodiments, the first to third communication holes CH1, CH2, and CH3 may be concurrently formed with the first and second source/drain contact holes SDH1 and SDH2, which are formed by patterning the second interlayered insulating layer 120. The first to third communication holes CH1, CH2, and CH3 may define the first to third connection contacts CC1, CC2, and CC3 connecting the gate electrodes spaced apart from each other. Accordingly, the separated gate electrodes may be connected to each other without additional formation of vias and conductive lines, and thus it becomes possible to simplify a process for fabricating a semiconductor device and increase an integration density of a semiconductor device.

Referring back to FIGS. 2 and 3A through 3F, the first to third mask layers M1, M2, and M3 may be removed. The removal of the first to third mask layers M1, M2, and M3 may be performed using an ashing and/or strip process. Next, a conductive layer may be formed on the second interlayered insulating layer 120 to fill the first to third communication holes CH1, CH2, and CH3 and the first and second source/drain contact holes SDH1 and SDH2. The conductive layer may include at least one of doped semiconductors, metals, and conductive metal nitrides. The conductive layer may be planarized to expose the second interlayered insulating layer 120 to form the first to third connection contacts CC1, CC2, and CC3 and the source/drain contacts SDC in the first to third communication holes CH1, CH2, and CH3 and the first and second source/drain contact holes SDH1 and SDH2, respectively.

For example, the first connection contact CC1 may include the first to third sub contacts CA1-CA3 and the first to third gate contacts CB1-CB3, which are connected to constitute a single body. The second connection contact CC2 may include the fourth sub contact CA4 and the sixth and seventh gate contacts CB6 and CB7, which are formed at both end portions of the fourth sub contact CA4, and the fourth sub contact CA4 and the sixth and seventh gate contacts CB6 and CB7 may be connected to constitute a single body. The third connection contact CC3 may include the fifth sub contact CA5 and the eighth gate contact CB8 formed at an end portion of the fifth sub contact CA5, and the fifth sub contact CA5 and the eighth gate contact CB8 may be connected to constitute a single body.

Next, the third interlayered insulating layer 130 and the fourth interlayered insulating layer 140 may be sequentially formed on the second interlayered insulating layer 120 to cover the first to third connection contacts CC1, CC2, and CC3 and the source/drain contacts SDC. The vias V1-V5 may be formed to penetrate the third interlayered insulating layer 130, and the conductive lines CBL1-CBL4 and the wires PW1 and PW2 may be formed in the fourth interlayered insulating layer 140.

Figure 12:
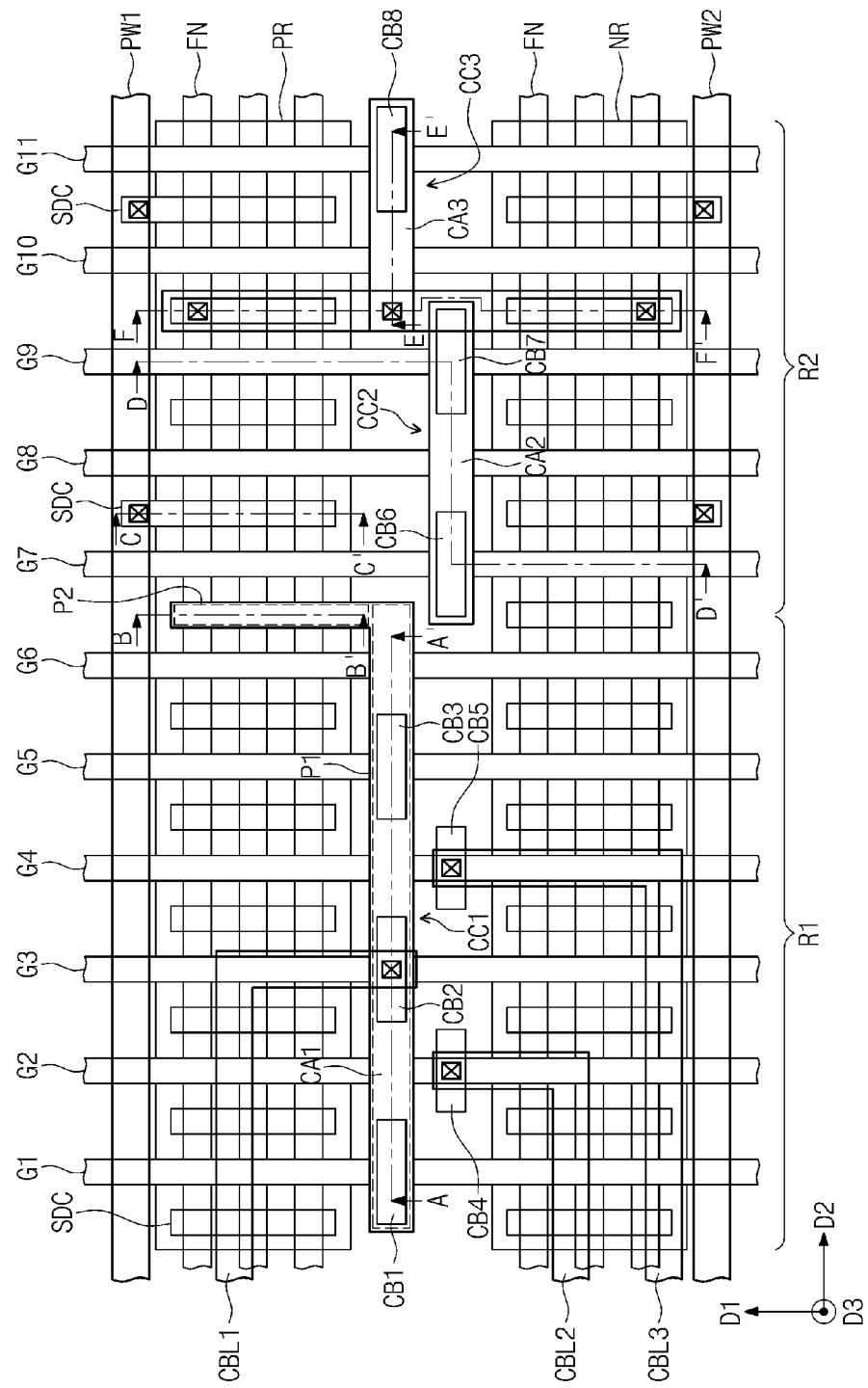
FIG. 12 is a plan view of the first logic cell of FIG. 1, which is illustrated to provide a description of a semiconductor device according to another example embodiment.
Figure 13A:
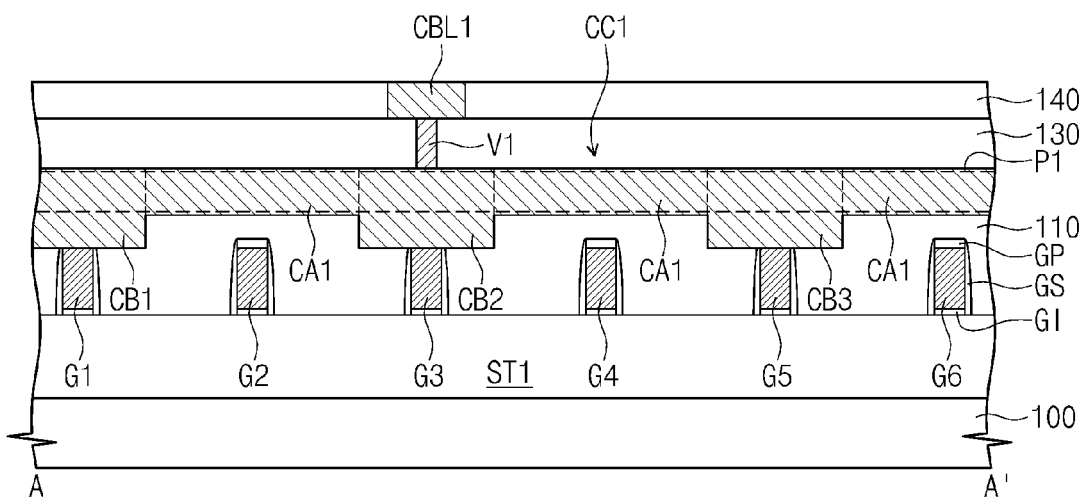
FIGS. 13A through 13F are sectional views taken along lines A-A', B-B', C-C', D-D', E-E', and F-F', respectively, of FIG. 12.
Figure 13B:
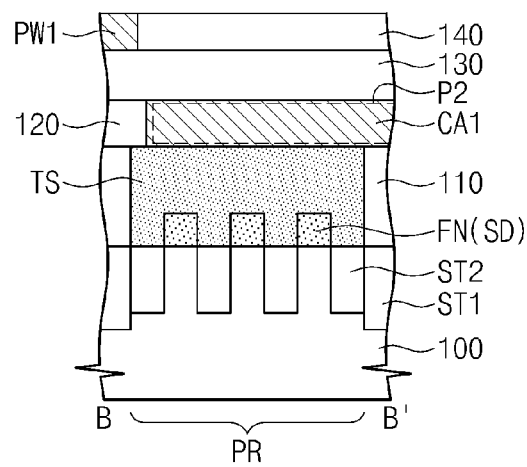
Figure 13C:
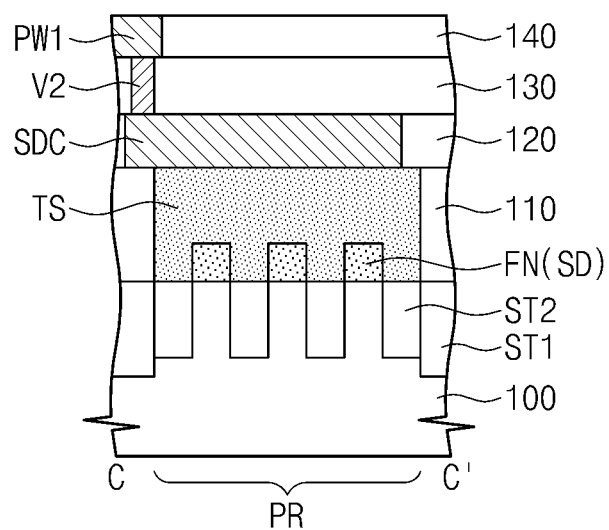
Figure 13D:
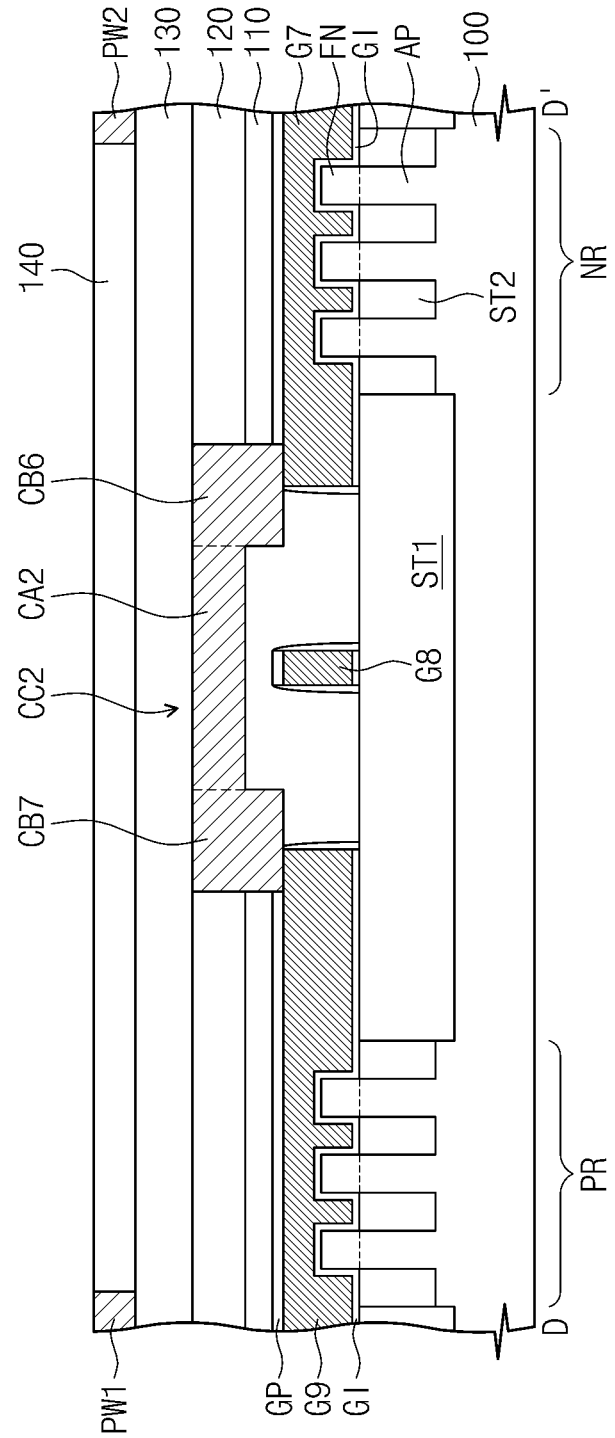
Figure 13E:
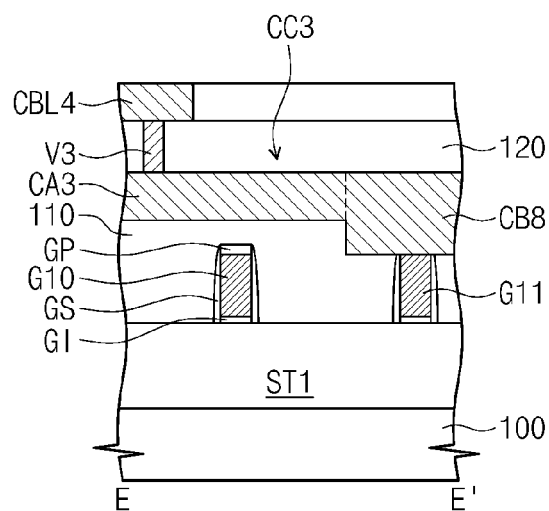
Figure 13F:
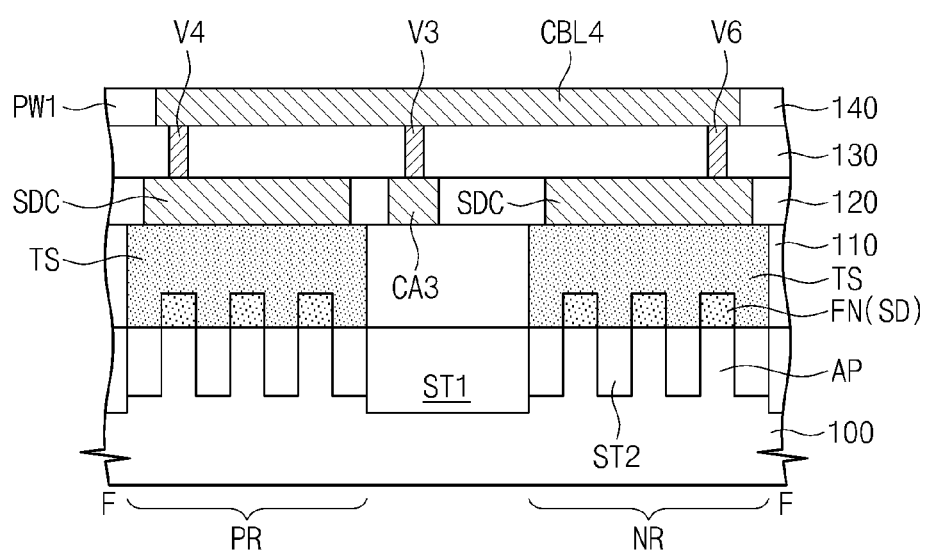

FIG. 12 is a plan view of the first logic cell C1 of FIG. 1, which is illustrated to provide a description of a semiconductor device according to another example embodiment. FIGS. 13A through 13F are sectional views taken along lines A-A', B-B', C-C', D-D', E-E', and F-F', respectively, of FIG. 12. In the following description, an element previously described with reference to FIGS. 2 and 3A through 3F may be identified by a similar or identical reference number and a repetitive description thereof will be omitted.

Referring to FIGS. 12, 13A, 13B, and 13C, the first connection contact CC1 may be provided on the first circuit region R1 to cross the first to sixth gate electrodes G1-G6. The first connection contact CC1 may include the first sub contact CA1 and the first to third gate contacts CB1-CB3.

The first sub contact CA1 may extend parallel to the second direction D2 and may cross the first to sixth gate electrodes G1-G6. In example embodiments, the first sub contact CA1 may include the first portion P1, which is disposed between the PMOSFET and NMOSFET regions PR and NR to extend in the second direction D2, and the second portion P2, which is extended from an end portion of the first portion P1 in the first direction D1 and is consequently overlapped with the PMOSFET region PR. The second portion P2 may be in contact with a top surface of the any one of the conductive connection patterns TS.

The first to third gate contacts CB1-CB3 may extend from the first sub contact CA1 toward the substrate 100 in a vertical direction (i.e., direction perpendicular to the first and second directions D1 and D2). The first to third gate contacts CB1-CB3 may be provided to penetrate the first interlayered insulating layer 110 and to be in contact with the top surfaces of the first, third, and fifth gate electrodes G1, G3, and G5, respectively. When viewed in a sectional view, a bottom surface of the first sub contact CA1 may be positioned at a higher level than bottom surfaces of the first to third gate contacts CB1-CB3.

Referring to FIGS. 12, 13D, 13E, and 13F, the second connection contact CC2 may be provided on the second circuit region R2 to cross the seventh to ninth gate electrodes G7-G9. Further, the third connection contact CC3 may be provided to cross the tenth and eleventh gate electrodes G10 and G11.

The second connection contact CC2 may include a second sub contact CA2, and the sixth and seventh gate contacts CB6 and CB7, which are vertically extended from the second sub contact CA2 toward the substrate 100. The second sub contact CA2 may extend in the second direction D2 to cross the seventh to ninth gate electrodes G7-G9. Here, the sixth and seventh gate contacts CB6 and CB7 may penetrate the first interlayered insulating layer 110 and may be in contact with the top surfaces of the seventh and ninth gate electrodes G7 and G9.

The third connection contact CC3 may include the third sub contact CA3 and the eighth gate contact CB8, which is vertically extended from the third sub contact CA3 toward the substrate 100. The third sub contact CA3 may extend parallel to the second direction D2 and may cross the tenth and eleventh gate electrodes G10 and G11. Here, the eighth gate contact CB8 may penetrate the first interlayered insulating layer 110 and may be in contact with the top surface of the eleventh gate electrode G11.

Except for the above described features, the first to third connection contacts CC1, CC2, and CC3 may be similar to the first to third connection contacts CC1, CC2, and CC3, respectively, which are described with reference to FIGS. 2 and 3A through 3F.

Figure 14:
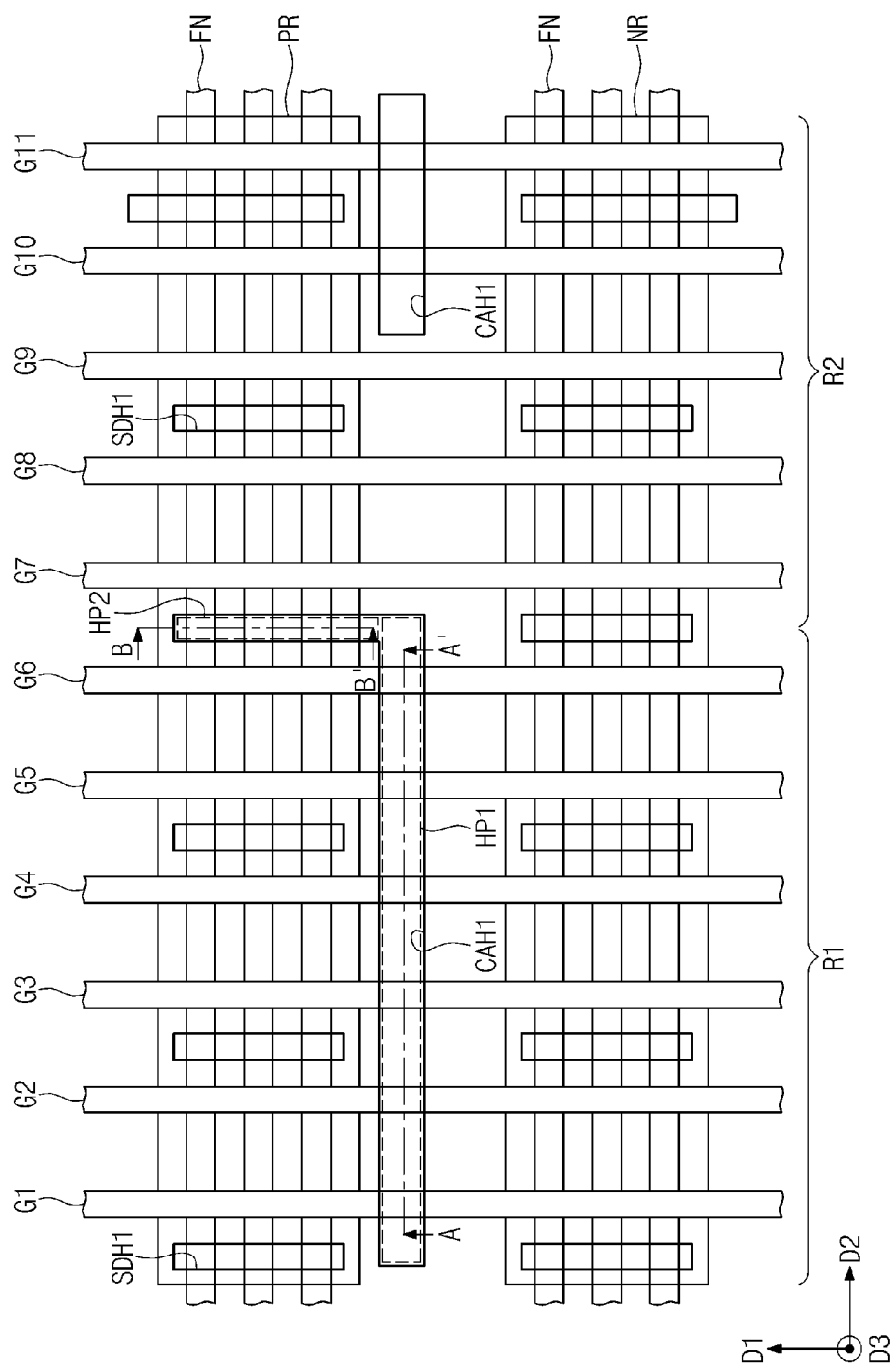
FIGS. 14 and 16 are plan views of the first logic cell of FIG. 1, which are illustrated to provide a description of a method of fabricating a semiconductor device according to other example embodiments.
Figure 15:
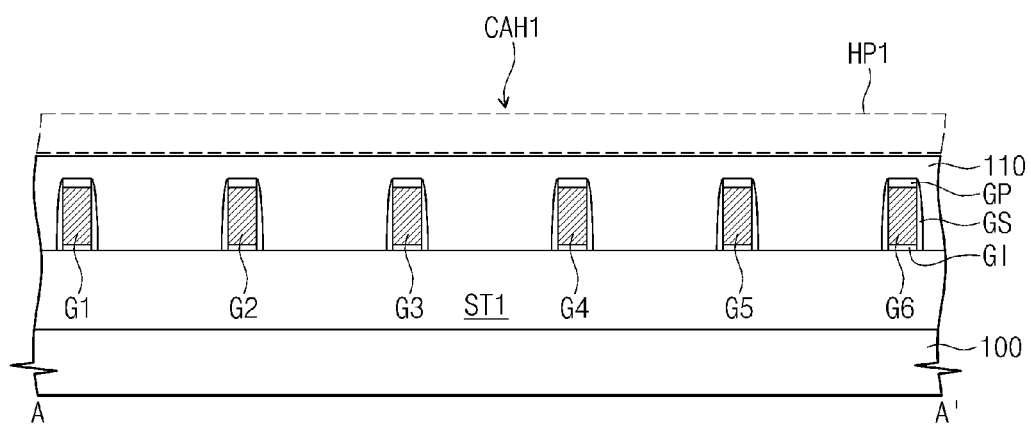
FIG. 15 is a sectional view taken along line A-A' of FIG. 14.
Figure 16:
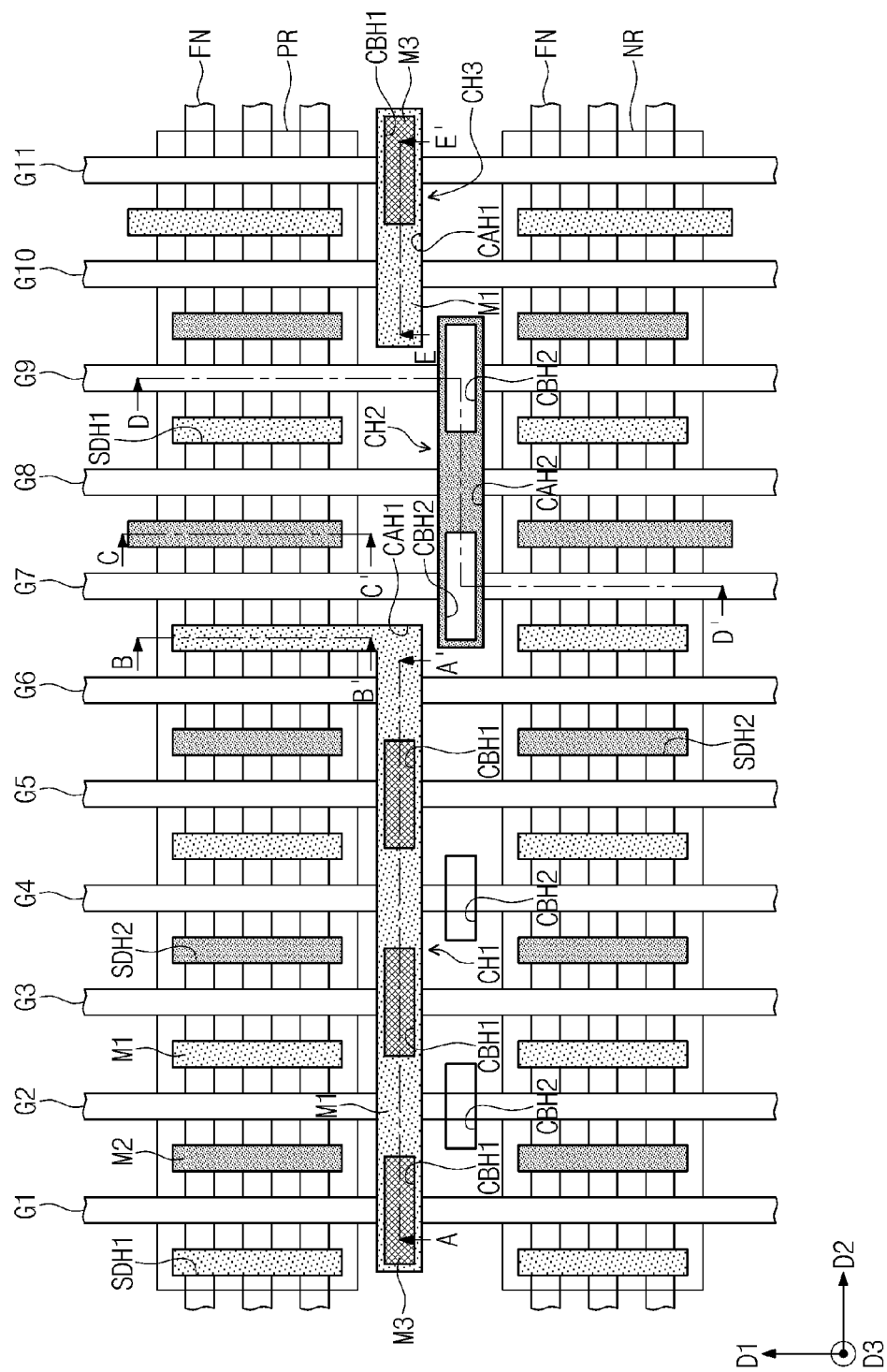

FIGS. 14 and 16 are plan views of the first logic cell C1 of FIG. 1, which are illustrated to provide a description of a method of fabricating a semiconductor device according to other example embodiments. FIG. 15 is a sectional view taken along line A-A' of FIG. 14. When taken along line B-B' of FIG. 14, a sectional view of the semiconductor device of FIG. 14 may be the same as that shown in FIG. 7B. When taken along lines A-A', B-B', C-C', D-D', and E-E' of FIG. 16, sectional views of the semiconductor device of FIG. 16 may be the same as those shown in FIGS. 11A through 11E, respectively. In the following description, an element previously described with reference to FIGS. 4, 5A, 6, 7A, 8, 9A, 10, and 11A may be identified by a similar or identical reference number and a repetitive description thereof will be omitted.

Referring to FIGS. 14, 7B, and 15, the second interlayered insulating layer 120 may be formed on a resulting structure described with reference to FIGS. 4, 5A and FIG. 5B. The first sub contact holes CAH1 and the first source/drain contact holes SDH1 may be formed by patterning the second interlayered insulating layer 120 using a first photomask (not shown).

In example embodiments, the first to sixth gate electrodes G1-G6 formed on the first circuit region R1 may constitute a gate electrode group. Unlike the first sub contact holes CAH1 on the first circuit region R1 previously described with reference to FIGS. 6, 7A, and 7B, the first sub contact hole CAH1 in the present embodiment may be formed to have a single body structure on the first circuit region R1. For example, the first sub contact hole CAH1 on the first circuit region R1 may be formed to extend in the second direction D2 and cross the gate electrode group. Further, the first sub contact hole CAH1 may include the first hole portion HP1, which is provided between the PMOSFET and NMOSFET regions PR and NR and is extended in the second direction D2, and the second hole portion HP2, which is extended from an end portion of the first hole portion HP1 in the first direction D1 and is overlapped with the PMOSFET region PR.

In addition, unlike the first sub contact hole CAH1 on the second circuit region R2 previously described with reference to FIGS. 6, 7A, and 7B, the first sub contact hole CAH1 on the second circuit region R2 in the present embodiment may be formed to cross two or more gate electrodes (e.g., the tenth and eleventh gate electrodes G10 and G11).

Referring to FIGS. 16 and 11A through 11E, the first mask layer M1 may be formed, as described with reference to FIGS. 8 and 9A to 9E. Next, the first mask layer M1 may be patterned using a second photomask (not shown) to form the second sub contact holes CAH2 and the second source/drain contact holes SDH2. Here, the second sub contact hole CAH2 may be formed to cross two or more gate electrodes (e.g., the seventh to ninth gate electrodes G7-G9).

Next, the second mask layer M2 may be formed on the first mask layer M1 to fill the second sub contact holes CAH2 and the second source/drain contact holes SDH2. The first gate contact holes CBH1 may be formed by patterning the second mask layer M2 using a third photomask (not shown). The first gate contact holes CBH1 may be formed in the first sub contact holes CAH1 or may be overlapped with the first sub contact holes CAH1. In other words, the formation of the first gate contact holes CBH1 may include etching the first sub contact holes CAH1 to expose the top surfaces of the first, third, fifth, and eleventh gate electrodes G1, G3, G5, and G11. Here, the first and fifth gate electrodes G1, G5 belong to the gate electrode group including the first to sixth gate electrodes G1 to G6 and are disposed at both side parts of the gate electrode group. One of the first sub contact hole CAH1 on the third gate electrode G3 may be between the first sub contact holes CAH1 on the first and fifth gate electrodes G1, G5.

Next, the third mask layer M3 may be formed on the second mask layer M2 to fill the first gate contact holes CBH1. The second gate contact holes CBH2 may be formed by pattering the third mask layer M3 using a fourth photomask (not shown). The second gate contact holes CBH2 on the second circuit region R2 may be formed in the second sub contact holes CAH2 to be overlapped with the second sub contact holes CAH2. In other words, the formation of the second gate contact holes CBH2 may include further etching the second sub contact holes CAH2 to expose the top surfaces of the seventh and ninth gate electrodes G7 and G9.

The first and second gate contact holes CBH1 and CBH2 may be formed to be connected to the first and second sub contact holes CAH1 and CAH2, respectively. In other words, the first communication hole CH1 may be formed on the first circuit region R1, and the first communication hole CH1 may include one first sub contact hole CAH1 and three first gate contact holes CBH1, which are formed in the first sub contact hole CAH1. The second and third communication holes CH2 and CH3 may be formed on the second circuit region R2. The second communication hole CH2 may include one second sub contact hole CAH2 and two second gate contact holes CBH2, which are formed in the second sub contact hole CAH2. The third communication hole CH3 may include one first sub contact hole CAH1 and one first gate contact hole CBH1, which is formed in the first sub contact hole CAH1.

Referring back to FIGS. 12, 3A, 3B, and 3C, the first to third mask layers M1, M2, and M3 may be removed. Next, the first to third connection contacts CC1, CC2, and CC3 and the source/drain contacts SDC may be formed in the first to third communication holes CH1, CH2, and CH3 and the first and second source/drain contact holes SDH1 and SDH2.

For example, the first connection contact CC1 may include the first sub contact CA1 and the first to third gate contacts CB1-CB3, which are connected to constitute a single body. The second connection contact CC2 may include the second sub contact CA2 and the sixth and seventh gate contacts CB6 and CB7, which are formed in the second sub contact CA2, and the second sub contact CA2 and the sixth and seventh gate contacts CB6 and CB7 may be connected to constitute a single body. The third connection contact CC3 may include the third sub contact CA3 and the eighth gate contact CB8 formed in the third sub contact CA3, and the third sub contact CA3 and the eighth gate contact CB8 may be connected to constitute a single body.

Next, the third interlayered insulating layer 130 and the fourth interlayered insulating layer 140 may be sequentially formed on the second interlayered insulating layer 120 to cover the first to third connection contacts CC1, CC2, and CC3 and the source/drain contacts SDC. The vias V1-V5 may be formed to penetrate the third interlayered insulating layer 130, and the conductive lines CBL1-CBL4 and the wires PW1 and PW2 may be formed in the fourth interlayered insulating layer 140.

Figure 17:
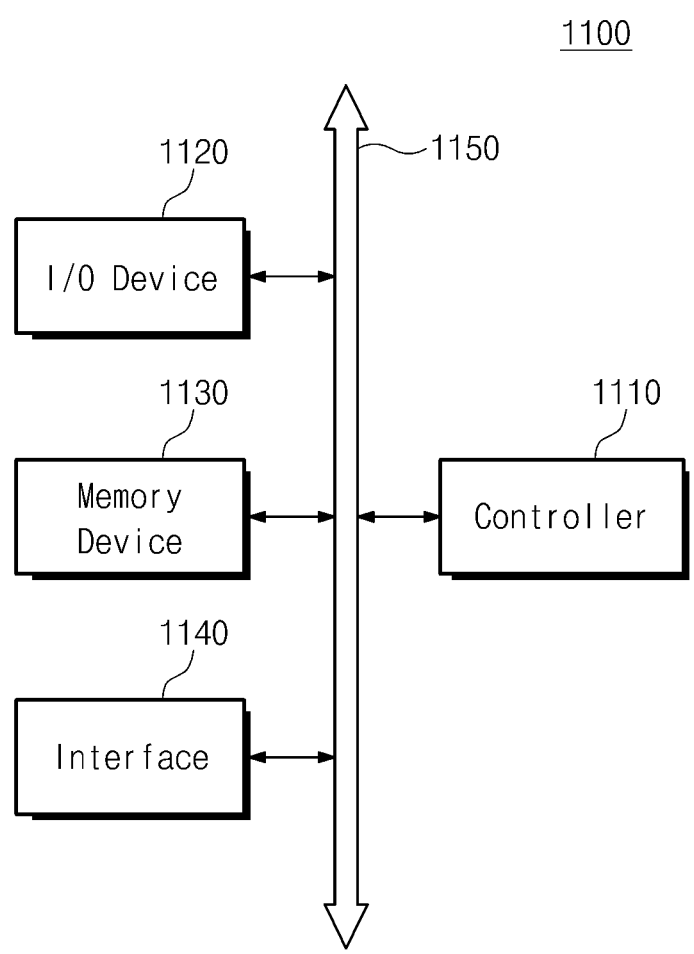
FIG. 17 is a schematic block diagram illustrating an example of electronic systems including a semiconductor device according to an example embodiment.

FIG. 17 is a schematic block diagram illustrating an example of electronic systems including a semiconductor device according to an example embodiment.

Referring to FIG. 17, an electronic system 1100 according to an example embodiment may include a controller 1110, an input/output (I/O) device 1120, a memory device 1130, an interface 1140, and a data bus 1150. At least two of the controller 1110, the I/O device 1120, the memory device 1130 and the interface 1140 may communicate with each other through the data bus 1150. The data bus 1150 may correspond to a path through which electrical signals are transmitted.

The controller 1110 may include at least one of a microprocessor, a digital signal processor, a microcontroller, and other similar logic devices. The I/O device 1120 may include a keypad, a keyboard or a display. The memory device 1130 may store data and/or commands. The interface 1140 may transmit electrical data to a communication network and/or may receive electrical data from a communication network. The interface 1140 may operate in a wireless or wired manner. For example, the interface 1140 may include an antenna for the wireless communication and/or a transceiver for the wired and/or wireless communication. Although not shown in the drawings, the electronic system 1100 may further include a fast dynamic random access memory (DRAM) device and/or a fast static random access memory (SRAM) device that acts as a cache memory for improving an operation of the controller 1110. The semiconductor device according to example embodiments may be use to provide all or some of the above described elements, e.g., the controller 1110 and/or the I/O device 1120.

The electronic system 1100 may be applied to a laptop computer, a personal digital assistant (PDA), a portable computer, a web tablet, a wireless phone, a mobile phone, a digital music player, a memory card, or any other electronic product, which is configured to receive and/or transmit information data in a wireless manner.

According to example embodiments, in a method of fabricating a semiconductor device, a connection contact connecting separated gate electrodes to each other may be concurrently formed with source/drain contacts. Accordingly, the separated gate electrodes may be connected to each other without additional formation of vias and conductive lines, and thus it becomes possible to simplify a process for fabricating a semiconductor device and increase an integration density of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
forming a first gate electrode and a second gate electrode extending substantially parallel to each other and each crossing a PMOSFET region on a substrate and an NMOSFET region on the substrate;
forming an interlayered insulating layer covering the first gate electrode and the second gate electrode;
patterning the interlayered insulating layer to form a first sub contact hole over the first gate electrode, the first sub contact hole not exposing a first top surface of the first gate electrode and not exposing a second top surface of the second gate electrode, wherein the first sub contact hole is positioned between the PMOSFET region and the NMOSFET region when viewed in a plan view, and wherein the first sub contact hole is not positioned directly over the PMOSFET region and not positioned directly over the NMOSFET region; and
after the first sub contact hole is formed over the first gate electrode, patterning the interlayered insulating layer to form a first gate contact hole and to expose the second top surface of the second gate electrode,
wherein the first sub contact hole and the first gate contact hole form a single communication hole.

2. The method of claim 1, further comprising:
forming a third gate electrode spaced apart from the first gate electrode, the second gate electrode being interposed between the first gate electrode and the third gate electrode; and
patterning the interlayered insulating layer to form a second sub contact hole over the third gate electrode,
wherein, when viewed in the plan view, the second sub contact hole is positioned between the PMOSFET region and the NMOSFET region,
the first and second sub contact holes are formed using different photomasks, and
the first and second sub contact holes are connected to the first gate contact hole to form the single communication hole.

3. The method of claim 2, further comprising:
forming a fourth gate electrode spaced apart from the second gate electrode, the third gate electrode being interposed between the fourth gate electrode and the second gate electrode; and patterning the interlayered insulating layer to form a third sub contact hole over the fourth gate electrode, wherein the first and third sub contact holes are concurrently formed using a same photomask, and wherein the forming the second sub contact hole comprises:

forming a first mask layer on the substrate to fill the first sub contact hole and the third sub contact hole, after the forming the first and third sub contact holes; and patterning the first mask layer and the interlayered insulating layer to form the second sub contact hole between the first sub contact hole and the third sub contact hole when viewed in the plan view.

4. The method of claim 3, wherein the forming the first gate contact hole comprises:

forming a second mask layer on the substrate to fill the second sub contact hole, after the forming the second sub contact holes; and patterning the second mask layer, the first mask layer, and the interlayered insulating layer to expose the second top surface of the second gate electrode.

5. The method of claim 2, wherein the first sub contact hole and the second sub contact hole are formed to have bottom surfaces that are positioned at levels different from levels of top surfaces of the first gate electrode and the third gate electrode.

6. The method of claim 2, wherein, when viewed in the plan view, the single communication hole is formed to be across the first gate electrode to the third gate electrode.

7. The method of claim 1, further comprising:

forming source/drain regions in at least one of the PMOSFET region and the NMOSFET region, the source/drain regions being positioned at a first side and a second side of the first gate electrode; and forming conductive connection patterns at the first side and the second side of the first gate electrode, the conductive connection patterns being connected to the source/drain regions, wherein, when viewed in the plan view, the first sub contact hole comprises an extended portion, which is overlapped with the at least one of the PMOSFET region and the NMOSFET region, the extended portion exposing a top surface of at least one of the conductive connection patterns.

8. The method of claim 1, further comprising:

forming source/drain regions in at least one of the PMOSFET region and the NMOSFET region, the source/drain regions being positioned on at least one of a first side and a second side of the first gate electrode and a third side and a fourth side of the second gate electrode;

forming conductive connection patterns on at least one of the first side and the second side of the first gate electrode and the third side and the fourth side of the second gate electrode, the conductive connection patterns being connected to the source/drain regions; and patterning the interlayered insulating layer to form a source/drain contact hole, which exposes a top surface of at least one of the conductive connection patterns, wherein the source/drain contact hole is concurrently formed with the first sub contact hole.

9. The method of claim 1, further comprising:

forming a fifth gate electrode spaced apart from the second gate electrode with the first gate electrode being interposed between the second gate electrode and the fifth gate electrode;

patterning the interlayered insulating layer to form a second gate contact hole, which exposes a top surface of the fifth gate electrode;

forming a conductive layer on the substrate to fill the first sub contact hole and the first and second gate contact holes; and planarizing the conductive layer to form a first sub contact and first and second gate contacts in the first sub contact hole and the first and second gate contact holes, respectively, wherein the first sub contact and the first and second gate contacts are connected to form a single connection contact, and the single connection contact electrically connects the second gate electrode to the fifth gate electrode.

10. The method of claim 1, further comprising:

forming device isolation layers to define active patterns in the PMOSFET region and the NMOSFET region, wherein the first gate electrode and the second gate electrode are formed to be across the active patterns.

11. A method of fabricating a semiconductor device, the method comprising:

forming a plurality of gate electrodes included in a gate electrode group, the plurality of gate electrodes each crossing a PMOSFET region on a substrate and an NMOSFET region on the substrate;

forming an interlayered insulating layer to cover the gate electrode group;

patterning the interlayered insulating layer to form a sub contact hole to be across the gate electrode group, the sub contact hole not exposing top surfaces of a first gate electrode and a second gate electrode of the gate electrode group, and being positioned between the PMOSFET region and the NMOSFET region when viewed in a plan view, wherein the sub contact hole is not positioned directly over the PMOSFET region and not positioned directly over the NMOSFET region; and after the sub contact hole is formed, patterning the interlayered insulating layer to form a first gate contact hole and a second gate contact hole, which expose the top surfaces of the first gate electrode and the second gate electrode of the gate electrode group, respectively, the first gate electrode being positioned at a first side portion of the gate electrode group and the second gate electrode being positioned at a second side portion of the gate electrode group, wherein the sub contact hole is connected to the first gate contact hole and the second gate contact hole to form a single communication hole.

12. The method of claim 11, wherein the sub contact hole is formed to have a bottom surface positioned at a level different from levels of top surfaces of the plurality of gate electrodes included in the gate electrode group, and wherein the first gate contact hole and the second gate contact hole have depths greater than a depth of the sub contact hole.

13. The method of claim 11, wherein the forming the first gate contact hole and the second gate contact hole comprises:

patterning the interlayered insulating layer to form a third gate contact hole, which exposes a top surface of a third gate electrode, the third gate electrode being included in the gate electrode group and positioned between the first gate electrode and the second gate electrode, wherein the first gate contact hole, the second gate contact hole, and the third gate contact hole are concurrently formed.

14. The method of claim 11, further comprising:
forming source/drain regions in at least one of the PMOSFET region and the NMOSFET region, the source/drain regions being positioned at a first side and a second side of each of the plurality of gate electrodes; and
forming conductive connection patterns at the first side and the second side of the each of the plurality of gate electrodes, the conductive connection patterns being connected to the source/drain regions,
wherein, when viewed in the plan view, the sub contact hole comprises a first portion crossing the gate electrode group in a first direction and a second portion extending from the first portion in a second direction, the second direction perpendicular to the first direction, to be overlapped with the at least one of the PMOSFET region and the NMOSFET region, and
the second portion of the sub contact hole is formed to expose a top surface of at least one of the conductive connection patterns.

15. The method of claim 11, wherein, when viewed in the plan view, the sub contact hole extends from the first gate electrode to the second gate electrode and is overlapped with the first contact hole and the second gate contact hole.

16. A method of fabricating a semiconductor device, the method comprising:
forming a first gate electrode and a second gate electrode extending substantially parallel to each other and each crossing a PMOSFET region on a substrate and an NMOSFET region on the substrate;
forming an interlayered insulating layer covering the first gate electrode and the second gate electrode;
patterning the interlayered insulating layer to form a sub contact hole over the first gate electrode, the sub contact hole not exposing a first top surface of the first gate electrode and not exposing a second top surface of the second gate electrode, the sub contact hole being positioned between the PMOSFET region and the NMOSFET region and crossing the first gate electrode when viewed in a plan view, wherein the sub contact hole is not positioned directly over the PMOSFET region and not positioned over the NMOSFET region;
forming a mask layer on the interlayered insulating layer to fill the sub contact hole; and
patterning the mask layer and the interlayered insulating layer to form a gate contact hole and to expose the second top surface of the second gate electrode,
wherein the sub contact hole and the gate contact hole form a single communication hole.

17. The method of claim 16, wherein the sub contact hole and the gate contact hole are formed using different photomasks.

18. The method of claim 16, further comprising:
forming a sub contact and a gate contact in the sub contact hole and the gate contact hole, respectively,
wherein the sub contact and the gate contact are connected to form a single connection contact such that a top surface of the sub contact is substantially coplanar with a top surface of the gate contact.

* * * * *